US010983075B2

(12) United States Patent
Baralia et al.

(10) Patent No.: US 10,983,075 B2
(45) Date of Patent: Apr. 20, 2021

(54) DEVICE AND METHOD FOR ANALYSING A DEFECT OF A PHOTOLITHOGRAPHIC MASK OR OF A WAFER

(71) Applicant: Carl Zeiss SMT GmbH, Oberkochen (DE)

(72) Inventors: Gabriel Baralia, Dieburg (DE); Christof Baur, Darmstadt (DE); Klaus Edinger, Lorsch (DE); Thorsten Hofmann, Rodgau (DE); Michael Budach, Hanau (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/481,693

(22) Filed: Apr. 7, 2017

(65) Prior Publication Data
US 2017/0292923 A1 Oct. 12, 2017

(30) Foreign Application Priority Data
Apr. 8, 2016 (DE) .......................... 102016205941.6

(51) Int. Cl.
*G01N 23/2251* (2018.01)
*H01J 37/317* (2006.01)
(Continued)

(52) U.S. Cl.
CPC ......... *G01N 23/2251* (2013.01); *G01Q 30/04* (2013.01); *G01Q 60/38* (2013.01);
(Continued)

(58) Field of Classification Search
CPC ..... G01N 2223/6116; G01N 2223/646; G01N 23/2251; G01Q 30/04; G01Q 60/38;
(Continued)

(56) References Cited
U.S. PATENT DOCUMENTS 5,043,578 A 8/1991 Guthner et al.
5,130,554 A * 7/1992 Nose ...................... B82Y 35/00
250/442.11
(Continued)

FOREIGN PATENT DOCUMENTS

DE 102011079382 1/2013 ............... G03F 1/72
DE 102011084829 4/2013 ............. G02B 21/00
(Continued)

OTHER PUBLICATIONS

Bouwens et al., "Enhancing re-detection efficacy of defects on blank wafers using stealth fiducial markers", *Microelectronic Engineering*, vol. 153, pp. 48-54 (2016).
(Continued)

*Primary Examiner* — Lan Vinh
(74) *Attorney, Agent, or Firm* — Fish & Richardson P.C.

(57) ABSTRACT

The present application relates to a scanning probe microscope comprising a probe arrangement for analyzing at least one defect of a photolithographic mask or of a wafer, wherein the scanning probe microscope comprises: (a) at least one first probe embodied to analyze the at least one defect; (b) means for producing at least one mark, by use of which the position of the at least one defect is indicated on the mask or on the wafer; and (c) wherein the mark is embodied in such a way that it may be detected by a scanning particle beam microscope.

11 Claims, 12 Drawing Sheets

(51) Int. Cl.

| | | |
|---|---|---|
| *G03F 1/84* | (2012.01) | |
| *G01Q 30/04* | (2010.01) | |
| *G01Q 60/38* | (2010.01) | |
| *G02B 21/00* | (2006.01) | |
| *G03F 7/20* | (2006.01) | |
| *H01J 37/28* | (2006.01) | |
| *H01J 37/32* | (2006.01) | |
| *G01Q 80/00* | (2010.01) | |
| *G01Q 70/06* | (2010.01) | |

(52) U.S. Cl.
CPC ........... *G02B 21/0016* (2013.01); *G03F 1/84* (2013.01); *G03F 7/7065* (2013.01); *H01J 37/28* (2013.01); *H01J 37/3178* (2013.01); *H01J 37/32366* (2013.01); *G01N 2223/6116* (2013.01); *G01N 2223/646* (2013.01); *G01Q 70/06* (2013.01); *G01Q 80/00* (2013.01); *H01J 2237/2814* (2013.01); *H01J 2237/334* (2013.01)

(58) Field of Classification Search
CPC .... G01Q 70/06; G01Q 80/00; G02B 21/0016; G03F 1/84; G03F 7/7065; H01J 2237/2814; H01J 2237/334; H01J 37/28; H01J 37/3178; H01J 37/32366
USPC ...... 216/12, 13, 41, 45; 324/754.01, 754.03, 324/754.07
See application file for complete search history.

(56) References Cited

U.S. PATENT DOCUMENTS

| | | | |
|---|---|---|---|
| 6,122,562 A | 9/2000 | Kinney et al. | |
| 6,566,654 B1* | 5/2003 | Funatsu | H01J 37/28 |
| | | | 250/306 |
| 6,683,316 B2 | 1/2004 | Schamber et al. | |
| 7,115,865 B2 | 10/2006 | Chang et al. | |
| 7,281,419 B2 | 10/2007 | Wang et al. | |
| 7,691,541 B2 | 4/2010 | Crocket et al. | |
| 9,164,371 B2 | 10/2015 | Kamo | |
| 9,336,983 B2* | 5/2016 | Budach | G01Q 30/02 |
| 2004/0178811 A1* | 9/2004 | Ishitani | G01R 31/303 |
| | | | 324/754.21 |
| 2007/0114401 A1* | 5/2007 | King | G03F 7/0002 |
| | | | 250/309 |
| 2009/0038383 A1 | 2/2009 | Nakaue et al. | |
| 2011/0291692 A1* | 12/2011 | Ando | H01J 37/20 |
| | | | 324/762.01 |
| 2013/0101188 A1 | 4/2013 | Sievers et al. | |
| 2014/0007306 A1 | 1/2014 | Baur et al. | |
| 2014/0027512 A1 | 1/2014 | Baur et al. | |
| 2014/0165236 A1* | 6/2014 | Budach | G03F 1/22 |
| | | | 850/9 |
| 2015/0169997 A1* | 6/2015 | Weber | H01J 37/26 |
| | | | 382/145 |
| 2015/0377921 A1* | 12/2015 | Ukraintsev | G01Q 30/02 |
| | | | 324/750.19 |
| 2015/0380210 A1 | 12/2015 | Budach et al. | |

FOREIGN PATENT DOCUMENTS

| | | | |
|---|---|---|---|
| DE | 102013225936 | 6/2015 | ............... G03F 1/72 |
| JP | 11-074163 | 3/1993 | ............... H01L 21/02 |
| JP | 05-142121 | 6/1993 | ............... G01N 1/28 |
| JP | H 10-260138 | 9/1998 | ............ G01N 21/88 |
| JP | 2009-003321 | 1/2009 | ............... G03F 1/08 |
| JP | 2011-249512 | 12/2011 | ............ H01L 12/027 |
| JP | 2014-517299 | 7/2014 | ............ G01Q 30/02 |
| JP | 2014-521230 | 8/2014 | ........... H01L 21/027 |
| KR | 1020140056279 | 5/2014 | ............... G03F 1/22 |
| TW | 200622235 | 7/2006 | ............. G01N 83/18 |
| TW | 201310165 | 3/2013 | ............... G03F 1/72 |
| WO | WO 2004/015496 | 2/2004 | |
| WO | WO 2012/110602 | 8/2012 | ............... G03F 1/00 |
| WO | WO 2012/163518 | 12/2012 | ............ H01J 37/28 |
| WO | WO 2013/010976 | 1/2013 | ............ H03F 1/22 |

OTHER PUBLICATIONS

Xie et al: "Nanoscale materials patterning and engineering by atomic force microscopy nanolithography"; *Materials Science and Engineering*, R 54, pp. 1-48 (2006).
Taiwan Office Action for Taiwan Patent Application No. 106111752 dated Feb. 12, 2018.
Japanese Office Action for Japanese Application No. 2017-077274 dated Apr. 16, 2018.
Korean First Office Action for Korean Application No. 10-2017-0045368 dated Oct. 8, 2018.

* cited by examiner

DEVICE AND METHOD FOR ANALYSING A DEFECT OF A PHOTOLITHOGRAPHIC MASK OR OF A WAFER

CROSS-REFERENCE TO RELATED APPLICATIONS

This application claims priority to German patent application 10 2016 205 941.6, filed on Apr. 8, 2016, the entire contents of which are herein incorporated by reference.

TECHNICAL FIELD

The present invention relates to a device and a method for analyzing a defect of a photolithographic mask or of a wafer. In particular, the invention relates to a device and a method for analyzing a phase defect of a photolithographic mask.

BACKGROUND

Scanning probe microscopes scan a sample or its surface with a probe and thus produce a three-dimensional representation of the topography of the sample surface. Below, scanning probe microscopes are abbreviated SPM. A distinction is made between various SPM types depending on the type of interaction between the measuring tip and the sample surface. Use is often made of scanning tunnelling microscopes (STMs), in which a voltage is applied between the sample and the measuring tip, which are not in contact with one another, and the resultant tunnelling current is measured. Hence, the use of the STM is restricted to conductive samples or samples provided with a conductive surface layer.

An atomic force microscope (AFM) or scanning force microscope (SFM) does not have this restriction on the sample to be examined. In this SPM type, the probe or the measuring tip is deflected by atomic forces, typically van der Waals forces, of the sample surface. The deflection of the measuring tip is proportional to the force acting between the probe and the sample surface and this force is used to determine the topography.

In addition to these conventional SPM types, there are a multiplicity of further apparatus types which are used for specific fields of application, such as, e.g., magnetic force microscopes or optical and acoustic near-field scanning microscopes.

Furthermore, it is known that scanning probe microscopes may also be used for targeted modification of a sample, or the surface thereof, by way of a suitable design of the interaction between the measuring tip and the sample. By way of example, U.S. Pat. No. 5,043,578 describes the deposition of gold nanostructures onto a conductive substrate with the aid of a conductive measuring tip of a scanning tunnelling microscope. In the review article "Nanoscale materials patterning and engineering by atomic force microscopy nanolithography" in Materials and Engineering R 54, (2006), pages 1-48, the authors X. N. Xie, H. J. Chung, C. H. Sow and A. T. S. Wee provide an overview of writing nanostructures into the surface of a sample and depositing nanostructures onto the surface of a sample.

WO 2012/110602 A1 by the applicant discloses a probe arrangement for a scanning probe microscope, said probe arrangement comprising one or more probes for analyzing a defect of a sample and comprising one or more probes for removing the analyzed defect. U.S. Pat. No. 7,281,419 B2 describes a multifunctional probe arrangement for a scanning probe microscope, comprising probes for examining a sample surface and probes for writing nanostructures onto the surface of the sample.

In addition to a scanning probe microscope, a scanning particle beam microscope, in particular in the form of a scanning electron microscope (SEM), is an important tool in order to, firstly, measure samples with a high resolution and, secondly, correct identified defects. By way of example, U.S. Pat. No. 9,164,371 B2 describes compensating defects buried in the multi-layer structure of a reflective photomask with the aid of an electron beam and an etching gas.

Defects in the micrometer and/or nanometer range may be detected with the aid of various measurement principles. Here, it should be noted that defects are represented differently when a plurality of measurement principles are used. By way of example, scanning probe microscopes cannot detect phase defects, in particular phase defects of photolithographic masks, or can only detect these poorly. In order to comprehensively analyze defects in the micrometer or nanometer range, these are therefore often examined using measurement methods which exploit various interactions with the sample. U.S. Pat. No. 6,683,316 B2 relates to the analysis of a sample with the aid of an optical image and an SEM image. WO 2013/010976 A2 describes examining a defect by use of ultraviolet radiation, a scanning probe microscope and a scanning particle beam microscope, and combining the data recorded by use of the three measuring tools.

Marks are often used for overlaying measurement data obtained with the aid of various interactions with the sample. Thus, the application DE 10 2011 084 829 A1 by the applicant, in a manner similar to U.S. Pat. No. 9,164,371 B2 already mentioned above, describes overlaying optical images and SEM images on the basis of registration marks.

In order to diffuse the overlay problem of measurement data obtained by various measurement methods, a scanning probe microscope and a scanning particle beam microscope have been combined in one apparatus in recent times. U.S. Ser. No. 14/755,264 reports such a combination apparatus. WO 2012/163518 describes options for overlaying measurement data recorded in combination apparatus by use of a scanning probe microscope and with the aid of a scanning particle beam microscope.

However, integrating a scanning probe microscope and a scanning particle beam microscope into one apparatus restricts the flexibility and possible applications of the two integrated tools. Firstly, a compromise has to be made in terms of the functionality of the two integrated tools for reasons of space. Secondly, the use of the two tools is restricted by the different requirements in respect of the operational environment for a scanning probe microscope and a scanning particle beam microscope.

The present invention is therefore based on the problem of specifying a device and a method for analyzing a defect in a sample, which improve the possibilities for the defect analysis and at least partly avoid the aforementioned disadvantages.

SUMMARY

In accordance with one exemplary embodiment of the present invention, this problem is solved by a device that comprises a scanning probe microscope comprising a probe arrangement for analyzing at least one defect of a photolithographic mask or of a wafer, wherein the device comprises: (a) at least one first probe embodied to analyze the at least one defect; (b) means for producing at least one mark, by use of which the position of the at least one defect on the photolithographic mask or on the wafer is indicated; and (c) wherein the mark is embodied in such a way that it may be detected by a scanning particle beam microscope.

In a first step, a scanning probe microscope according to the invention analyzes a defect of a photolithographic mask or of a wafer using one or more probes. Then, the scanning probe microscope produces one or more marks in the vicinity of the analyzed defect. The produced mark(s) has/have the property that it/they may easily be detected by a particle beam of a scanning particle beam microscope. In some implementations, unlike, e.g., the defect, the at least one mark is configured to be clearly visible in the image of a scanning particle beam microscope in order to be able to determine the position of the defect of the sample with a high accuracy. As a result, a scanning probe microscope according to the invention makes it easier for a scanning particle beam microscope to find a defect which does not produce any material contrast in the scanning particle beam microscope and which has no, or only a weak, topography contrast.

According to one aspect, the at least one first probe is embodied to analyze a defect which cannot be detected, or cannot be detected reliably, by the scanning particle beam microscope. The at least one mark may be embodied to produce a material contrast in an image of the scanning particle beam microscope.

An example of such a defect is a phase defect of a photolithographic mask. By way of example, a phase defect is caused by large-area unevenness of a substrate of a photomask. In the case of photomasks or simple masks designed for short-wavelength photolithography apparatuses, deviations from a predetermined contour in the single-digit nanometer range already suffice to produce phase defects. Phase defects are hardly detectable using a scanning particle beam microscope on account of the lack of material contrast and the hardly present topography contrast. By contrast, a scanning probe microscope may detect unevenness in the sub-nanometer range. The position of a phase defect of a photolithographic mask may be indicated to a scanning particle beam microscope with the aid of one or more marks. The scanning particle beam microscope may use the marks when correcting defects. The overlay problem of measurement data recorded on the basis of two different interactions with the sample, as set forth in the introductory part, may be largely avoided.

A scanning probe microscope may further comprise a control unit embodied to apply the at least one mark to the sample in such a way that both the at least one mark and at least a part of the at least one defect are arranged in a single scanning region of the scanning probe microscope.

This condition ensures that the distance between the defect and the mark or marks may be ascertained with a high accuracy.

The scanning region of a probe of a scanning probe microscope may comprise a square or quadrilateral with a side length of 0.1 µm to 400 µm, preferably 0.5 µm to 10 µm and most preferably 1 µm to 5 µm.

The scanning region of the scanning probe microscope or the field of view thereof is the area over which a measuring tip of a probe may pass by actuating an actuator of the probe, preferably a piezo-actuator, without the scanning probe microscope and the photolithographic mask or the wafer, or the sample stage on which the mask or the wafer is arranged, being moved relative to one another.

As already mentioned above, the coordinates of the footprint of the defect are known with great precision relative to the coordinates of the at least one mark by virtue of at least one mark being attached on the surface of the sample in relation to a defect in such a way that the at least one mark and at least part of a defect are arranged within one scanning region.

Below, the expressions "photolithographic mask," "photomask," and "mask" are used synonymously. The photolithographic mask may comprise a reflective photomask or a transmissive photomask. The term wafer comprises an unprocessed semiconductor slice and reaches as far as the finished semiconductor component.

In a further aspect, analyzing the at least one defect comprises determining topography data of the at least one defect and position data of the at least one mark by use of the control unit of the scanning probe microscope.

The control unit may further be embodied to relate the position data of the at least one mark to the topography data of the at least one defect.

As already indicated, probes of a scanning probe microscope may scan the surface of a sample, and hence of a mask or of a wafer, with the resolution in the sub-nanometer range. As a result, it is possible to determine an accurate three-dimensional image of a defect of the sample.

Topography data of a defect comprise the points of a footprint of a defect, i.e. the xy-coordinates in relation to the position or the coordinates of the at least one mark. Further, the topography data of a defect contain the height or the depression of the defect, i.e., its z-coordinate relative to a defect-free surface of the mask or of the wafer.

The mask of the wafer may have at least one fiducial mark. The at least one fiducial mark is correlated with the marked defect in the coordinate system of the scanning probe microscope. This correlation is transferred into the coordinate system of the scanning particle beam microscope. Using the correlation, it is therefore possible to transfer an image from the coordinate system of the scanning probe microscope into the coordinate system of the scanning particle beam microscope.

The control unit may be embodied further to store position data of the at least one mark and/or the topography data of the at least one defect in a non-volatile memory.

The measurement data determined by the scanning probe microscope may thus easily be provided to a device for correcting a defect, i.e., for example, a scanning particle beam microscope. This makes it easier to find a defect using a scanning particle beam microscope. This applies, in particular, to phase defects of a photolithographic mask which—as already explained above—cannot be imaged, or can only be imaged with great difficulties, using the particle beam of a scanning particle beam microscope.

The control unit may be further embodied to determine a repair template for correcting the at least one defect from the topography data of the at least one defect.

A repair template defines the spatial and temporal distribution of the intensity of a particle beam and the time curve of a gas flow rate of an etching gas or of a deposition gas for correcting or compensating a defect of a mask or of a wafer.

In one aspect, the at least one produced mark has a defined relationship with at least one reference mark present on the mask or on the wafer.

Hence, the position of a defect is known by way of the relationship thereof to the at least one mark in the coordinate system of the mask or of the wafer. By way of example, this renders it possible to localize the position of a defect for the purposes of correcting the latter, even if the defect (e.g., a phase defect of a photolithographic mask) is not visible in an image produced by the particle beam.

The control unit may be configured to apply at least two marks on opposite sides of the at least one defect. Further, the control unit may be embodied to produce four marks, which are arranged at the corners of a rectangle which includes the at least one defect.

Applying two or more marks for a single defect firstly increases the outlay for producing the marks and secondly increases the outlay for removing the marks after the defect has been corrected. In return, a more accurate localization of a defect during the repair of the latter is possible on the basis of two or more marks.

The means for producing the at least one mark may comprise the at least one first probe, which is embodied to produce at least one depression in the photolithographic mask or in the wafer.

In the simplest embodiment, the probe arrangement of a scanning probe microscope comprises a single probe which, in a first mode of operation, is used for analyzing one or more defects. In a second mode of operation, the single probe is used to produce one or more marks for the discovered defect. By way of example, this may be carried out by producing one or more depressions in the mask or in the wafer.

In one aspect, the at least one first probe comprises at least two probes which are embodied to analyze the at least one defect.

Using a probe arrangement comprising two or more analysis probes which, for example, may interact with the sample by way of different mechanisms or have different radii of curvature of the measuring tip, it is possible to determine a comprehensive image of the mask or of the wafer or of one or more defects present on the surface. The optimization of the two or more analysis probes may be carried out by way of, for example, the geometry and the material selection for these probes. Secondly, the holder of these probes may be optimized for satisfying this function.

Moreover, different defects, which comprise different defect types and/or have specific positions, may be present on the mask or on the wafer. One of the at least two probes may be used additionally for producing one or more marks on the mask or on the wafer.

The means for producing the at least one mark may comprise at least one second probe, which is embodied to produce at least one depression in the photolithographic mask or in the wafer. The at least one depression may be produced in an element of the absorber structure of the photolithographic mask.

The techniques for producing a structure in the surface of a mask or of a wafer are explained in the introductory part of the aforementioned overview article in the passage relating to the term "force-assisted nanolithography."

A probe arrangement comprising at least two probes is advantageous as these may be optimized for carrying out different functions or objects. The at least one second probe may be designed in a targeted manner to modify the mask or the wafer in a predetermined manner and thereby produce a mark on the mask or on the wafer. By way of example, the parameters for the design of a tip of such a probe depend on whether a mark is produced on the sample by depositing material on the sample or by producing a structure in the surface of the sample. The holder of the second probe—which, as is conventional in the specialist field, is also referred to as cantilever below—and the measuring tip of the second probe are embodied in such a way that the tip may be used in an ideal manner to satisfy the predetermined function. Additionally, the control unit of a scanning probe microscope according to the invention facilitates adapting the mode of operation of the second probe to the function to be carried out. Furthermore, a probe arrangement may comprise a plurality of second probes for producing more than one mark. By way of example, a probe arrangement may comprise a first second probe which produces a first mark by producing a depression in the sample and a further second probe for depositing material on the sample in order to produce a second mark by depositing material onto the surface of the sample. Therefore, it is possible to manufacture probe arrangements for a scanning probe microscope according to the invention, the individual probes of which are optimized for specific applications.

Preferably, only one probe of the probe arrangement is operated at any one time, while the other probe or other probes is/are situated in a rest position in which the tip of this probe or the tips of these probes preferably is/are held at a distance from the surface of the wafer or of the mask which is large enough in order to substantially prevent an interaction of this probe or these probes with the mask or the wafer or the defect of the mask or of the wafer. As a result, the outlay in terms of apparatus for installing one of the above-defined probe arrangements into a conventional scanning probe microscope is low. However, it is important that each one of the probes may be brought quickly and reproducibly into a defined working position from the respective rest position by way of a movement element or a plurality of movement elements.

The means for producing the at least one mark may comprise at least one second probe embodied to deposit material as at least one mark on the photolithographic mask or on the wafer by applying a voltage to a measuring tip of the at least one second probe. The material of the at least one mark may be deposited on an element of the absorber structure of the photolithographic mask.

Material may be deposited onto the surface of a mask or of a wafer by applying a DC voltage or as a result of voltage pulses between the sample and the measuring tip of the second probe in a water meniscus between the measuring tip and the sample surface. The overview article "Nanoscale material patterning and engineering by atomic force microscopy nanolithography" by X. N. Xie, H. J. Chung, C. H. Sow and A. T. S. Wee mentioned in the second section describes this technique, which may be used for applying a mark onto the surface of a sample, as "bias-assisted nanolithography."

The tip of a second probe is not used for measuring the surface and, strictly speaking, therefore does not constitute a measuring tip. Below, a tip of a second probe used to deposit material onto the surface of a mask or of a wafer or to modify the surface of the mask or of the wafer is likewise referred to as a measuring tip.

The means for producing the at least one mark may comprise at least one second probe (embodied to produce the at least one mark by direct writing of ink in a dip pen nanolithography process. The at least one mark may be produced by depositing material on a substrate and/or on an element of the absorber structure of the photolithographic mask.

Producing one or more marks by direct writing by use of a DPN (dip pen nanolithography) process is advantageous in that the mark(s) may be produced substantially without damaging the mask or the wafer and may be removed from the mask or the wafer again with little outlay. The techniques for depositing a structure and hence a mark on the surface of a mask or of a wafer are discussed in the aforementioned overview article in the passage relating to the term "dip pen nanolithography."

The control unit may be embodied to use design data of the photolithographic mask for determining the position for applying the at least one mark.

This renders it possible to ensure that a mark is, e.g., not applied to an edge of an element of the absorber structure of a photomask. In that case, it may only be detected with difficulty by a particle beam of a scanning particle beam microscope. Moreover, application and removal of a mark from a mask surface may be simplified by including the design data of the mask. By way of example, this may be brought about by virtue of, in the case of a photomask, the marks preferably being produced on elements of the absorber structure which, in respect of printable defects, are less critical than the substrate of a transparent mask or the multi-layer reflection structure of a reflective mask.

The at least one mark may comprise at least one edge roughness of at least one element of the absorber structure.

In the case of a pronounced edge roughness of at least one element of the absorber structure, it may be used as only mark for a defect of the photomask situated in the vicinity. However, an edge roughness is preferably used as an additional mark, in addition to at least one further mark which is produced on the mask with the aid of one of the second probes of the scanning probe microscope. Further, it may be necessary to consider a pronounced edge roughness to be a defect of the photomask and accordingly remove it.

The at least one first probe and the at least one second probe may have a spacing of 1000 μm to 50 μm, preferably 500 μm to 100 μm and most preferably 250 μm to 200 μm. The at least one first probe and the at least one second probe of a probe arrangement may be embodied as a microelectromechanical system (MEMS), in which the accuracy of the spacing of the at least one first probe and the at least one second probe is less than 1 μm, preferably less than 200 nm and most preferably less than 50 nm.

The scanning probe microscope may comprise an interface for transferring the position data of the at least one mark and/or the topography data of the at least one defect and/or the repair template of the at least one defect to the scanning particle beam microscope.

The transfer of the position data of the mark(s) and, additionally, at least the topography data of the defect or the defects of the mask or of the wafer to a repairing tool, such as, e.g., a scanning particle beam microscope, very substantially simplifies the removal or compensation of the defect or the defects by the repairing tool.

The scanning probe microscope may comprise a scanning force microscope.

A measuring system may comprise a scanning probe microscope according to one of the aspects described above and a scanning particle beam microscope, with the latter comprising an interface for receiving position data of the at least one mark and/or the topography data of the at least one defect and/or the repair template of the at least one defect.

The at least one mark is embodied in such a way that it may be determined with a high spatial resolution by the scanning particle beam microscope. By virtue of the topography data of the defect or of the defects or even the repair template(s) thereof being provided to the scanning particle beam microscope, the scanning particle beam microscope is able to localize the defect or defects with a high accuracy and, as a result thereof, remove these with high precision. The overlay problem of measurement data ascertained by different interaction mechanisms with the mask or with the wafer, as explained in the introductory part, is largely dispensed with. As a result, the possible applications of both a scanning probe microscope according to the invention and a scanning particle beam microscope are optimized.

The scanning particle beam microscope may comprise a control unit embodied to scan at least one particle beam for detecting the at least one mark and the at least one defect over the photolithographic mask or the wafer.

The control unit of the scanning particle beam microscope may be embodied to determine a repair template for the at least one defect from scanning data of the particle beam, the position data of the at least one mark and the topography data of the at least one defect.

The scanning particle beam microscope may further comprise: (a) at least one first storage container embodied to store at least one etching gas; and/or (b) at least one second storage container embodied to store at least one deposition gas; and/or (c) at least one supply system comprising at least one first valve for the at least one first storage container and at least one second valve for the at least one second storage container, wherein the supply system is embodied to provide the at least one etching gas and/or the at least one deposition gas at a position of the defect and of the at least one mark.

As a result of these additional components, the scanning particle beam microscope may, in addition to the analysis of a defect, also be used for the correction thereof.

The control unit of the scanning particle beam microscope may be further embodied, on the basis of the repair template, to control the at least one particle beam and the gas flow rate of the at least one etching gas or the gas flow rate of the at least one deposition gas for correcting the at least one defect.

The control unit of the scanning particle beam microscope may be further embodied to control the gas flow rate of the at least one etching gas or the gas flow rate of the at least one deposition gas for correcting the at least one defect. The at least one defect may be corrected in vacuum surroundings.

The control unit of the scanning particle beam microscope may be embodied to control the at least one particle beam and the gas flow rate of the at least one etching gas or the gas flow rate of the at least one deposition gas for removing the at least one mark. The control unit of the scanning particle beam microscope may further be embodied to control the at least one particle beam and a gas flow rate of the at least one etching gas or a gas flow rate of the at least one deposition gas for removing the at least one mark.

In addition to precisely correcting the defect or the defects, the defined scanning particle beam microscope may additionally remove the mark(s) in a largely residue-free manner from the mask or from the wafer. The mark(s) may be removed by use of an etching process if the mark(s) were realized in the form of deposited material. Should the mark(s) be produced in the form of depressions, these may be removed by depositing material over the mark(s).

The control unit of the scanning particle beam microscope may moreover be embodied to automatically identify the at least one mark from the position data of the mark.

The control unit of the scanning particle beam microscope may further be embodied to automatically overlay the position data of the at least one mark on the scanning data of the at least one particle beam.

The measuring system may moreover comprise a cleaning device which is embodied to remove the at least one mark by use of a chemical cleaning process.

Removing the mark(s) within the scope of a necessary cleaning step during a production process of a mask or of a wafer avoids an additional process step for removing the mark(s).

The at least one etching gas may comprise: xenon difluoride ($XeF_2$), oxygen ($O_2$), ozone ($O_3$), water vapor ($H_2O$), hydrogen peroxide ($H_2O_2$), dinitrogen monoxide ($N_2O$), nitric oxide (NO), nitrogen dioxide ($NO_2$), nitric acid ($HNO_3$), chlorine ($Cl_2$), hydrogen chloride (HCl), hydrofluoric acid (HF), iodine ($I_2$), hydrogen iodine (HI), bromine ($Br_2$), hydrogen bromide (HBr), nitrosyl chloride (NOCl), phosphorus trichloride ($PCl_3$), phosphorus pentachloride ($PCl_5$), phosphorus trifluoride ($PF_3$) and nitrogen trifluoride ($NF_3$).

The at least one deposition gas may comprise: a metal carbonyl, such as chromium hexacarbonyl ($Cr(CO)_6$), molybdenum hexacarbonyl ($Mo(CO)_6$), tungsten hexacarbonyl ($W(CO)_6$), dicobalt octacarbonyl ($Co_2(CO)_8$), triruthenium dodecacarbonyl ($Ru_3(CO)_{12}$) or iron pentacarbonyl ($Fe(CO)_5$), a metal alkyl, such as cyclopentadienyl (Cp), trimethylplatinium ($CpPtMe_3$), methylcyclopentadienyl (MeCp), trimethylplatinium ($MeCpPtMe_3$), tetramethyltin ($SnMe_4$), trimethylgallium ($GaMe_3$) or ferrocene cyclopentadienyl ($Cp_2Fe$), a metal halide, such as tungsten hexachloride ($WCl_6$), titanium tetrachloride ($TiCl_4$), boron trichloride ($BCl_3$) or silicon tetrachloride ($SiCl_4$), a metal alkoxide, such as tetraethyl orthosilicate ($Si(OC_2H_5)_4$) or titanium isopropoxide ($Ti(OCH(CH_3)_2)_4$). Further, the at least one deposition gas may comprise an organic carbon compound. The organic carbon compound may comprise: ethylene ($C_2H_4$), styrene ($C_8H_8$), pyrene ($C_{16}H_{10}$), hexadecane ($C_{16}H_{34}$), liquid paraffins ($C_{12}H_{26}$ to $C_{18}H_{38}$), methanoic acid ($CH_2O_2$), acetic acid ($C_2H_4O_2$), acrylic acid ($C_3H_4O_2$), propionic acid ($C_3H_6O_2$) and/or methyl methacrylate (MMA) ($C_5H_8O_2$).

The at least one interface of the scanning particle beam microscope may comprise a transmitter/receiver combination for wireless transmission of a query to a scanning probe microscope and for reception of position data of the at least one mark and/or the topography data of the at least one defect and/or repair template of the at least one defect.

The control unit of the scanning particle beam microscope may further be embodied to determine the position of the at least one mark with a defined reference to at least one reference mark present on the mask or on the wafer.

A scanning particle beam microscope may comprise a scanning electron microscope.

A method for analyzing at least one defect of a photolithographic mask or of a wafer comprises the following steps: (a) analyzing the at least one defect using a scanning probe microscope; (b) producing at least one mark on the photolithographic mask or on the wafer using the scanning probe microscope, wherein the at least one mark is embodied in such a way that it may be detected by a scanning particle beam microscope; and (c) detecting the at least one mark using at least one particle beam of the scanning particle beam microscope.

Starting a process for analyzing defects of a photomask or of a wafer with a scanning probe microscope instead of a scanning particle beam microscope offers at least two advantages: firstly, the scanning probe microscope is able to examine defects which are invisible to the scanning particle beam microscope. This increases the reliability of the defect analysis. Secondly, marks may be produced in a simpler manner with the aid of a scanning probe microscope—when compared to the options of a scanning particle beam microscope. Since the scanning probe microscope opens up a multiplicity of options for producing one or more marks, the mark may be designed in such a way that it is ideally differentiated from the surroundings thereof. Moreover, the mark may be produced in such a way that it may easily be removed from the mask or from the wafer after completion of a defect repairing process. Finally, applying one or more marks by way of the scanning probe microscope frees up valuable time for the repairing device, namely the scanning particle beam microscope.

The at least one defect may comprise a defect which cannot be detected, or cannot be detected reliably, by the scanning particle beam microscope.

An important class of such defects are the phase defects of photolithographic masks, which have already been discussed above.

In one aspect, the at least one mark is produced so close to the at least one defect that at least part of the defect and the at least one mark are arranged in a single scanning region of the scanning probe microscope.

Analyzing the at least one defect may comprise determining topography data of the at least one defect and position data of the at least one mark.

Another aspect furthermore comprises the step of: determining a repair template for the at least one defect from the topography data of the at least one defect.

A further aspect also comprises the step of: storing position data of the at least one mark and/or the topography data of the at least one defect and/or a repair template of the at least one defect in a non-volatile memory of the scanning probe microscope.

Further, the method may comprise the step of: transferring the position data of the at least one mark and/or the topography data of the at least one defect and/or the repair template from the scanning probe microscope to the scanning particle beam microscope.

The method may comprise the step of: scanning the at least one defect and the at least one mark by use of the at least one particle beam of the scanning particle beam microscope.

One aspect comprises the step of overlaying data of the particle beam scan on the position data of the at least one mark and the topography data of the at least one defect for determining a repair template for the at least one defect.

Detecting the position data of the at least one mark may be carried out by use of a computer-assisted identification of marks.

Producing the at least one mark may comprise: using design data of a photolithographic mask for determining a position to apply the at least one mark.

One aspect further comprises the step of: correcting the at least one defect by use of the repair template, the at least one particle beam and at least one etching gas or at least one deposition gas. Another aspect furthermore comprises the step of: correcting the at least one defect by use of the repair template and at least one etching gas or at least one deposition gas.

A further aspect also comprises the step of: removing the at least one mark from the photolithographic mask or from the wafer using the at least one particle beam and at least one etching gas or at least one deposition gas. Another aspect further comprises the step of: removing the at least one mark from the photolithographic mask or from the wafer using at least one etching gas or at least one deposition gas.

The method may moreover comprise the step of: removing the at least one mark from the photolithographic mask or from the wafer using a chemical cleaning step. The chemical cleaning step may be a wet-chemical cleaning step.

The method may furthermore comprise the step of: producing the at least one mark with a defined relationship with at least one reference mark present on the mask or on the wafer. Moreover, the method may comprise the step of: determining the position data of the at least one mark in relation to at least one fiducial mark of a sample stage, on which the mask or the wafer is arranged.

Producing the at least one mark may comprise: producing at least one depression in an element of an absorber structure of a photolithographic mask. Further, producing the at least one mark may comprise: depositing material on a substrate and/or on an element of the absorber structure of a photolithographic mask.

DESCRIPTION OF DRAWINGS

The following detailed description describes currently preferred exemplary embodiments of the invention, with reference being made to the drawings, in which.

DETAILED DESCRIPTION

Currently preferred embodiments of a device according to the invention and of a method according to the invention are explained in more detail below. It is understood that the device according to the invention and the method according to the invention are not restricted to the exemplary embodiments below.

Figure 1:
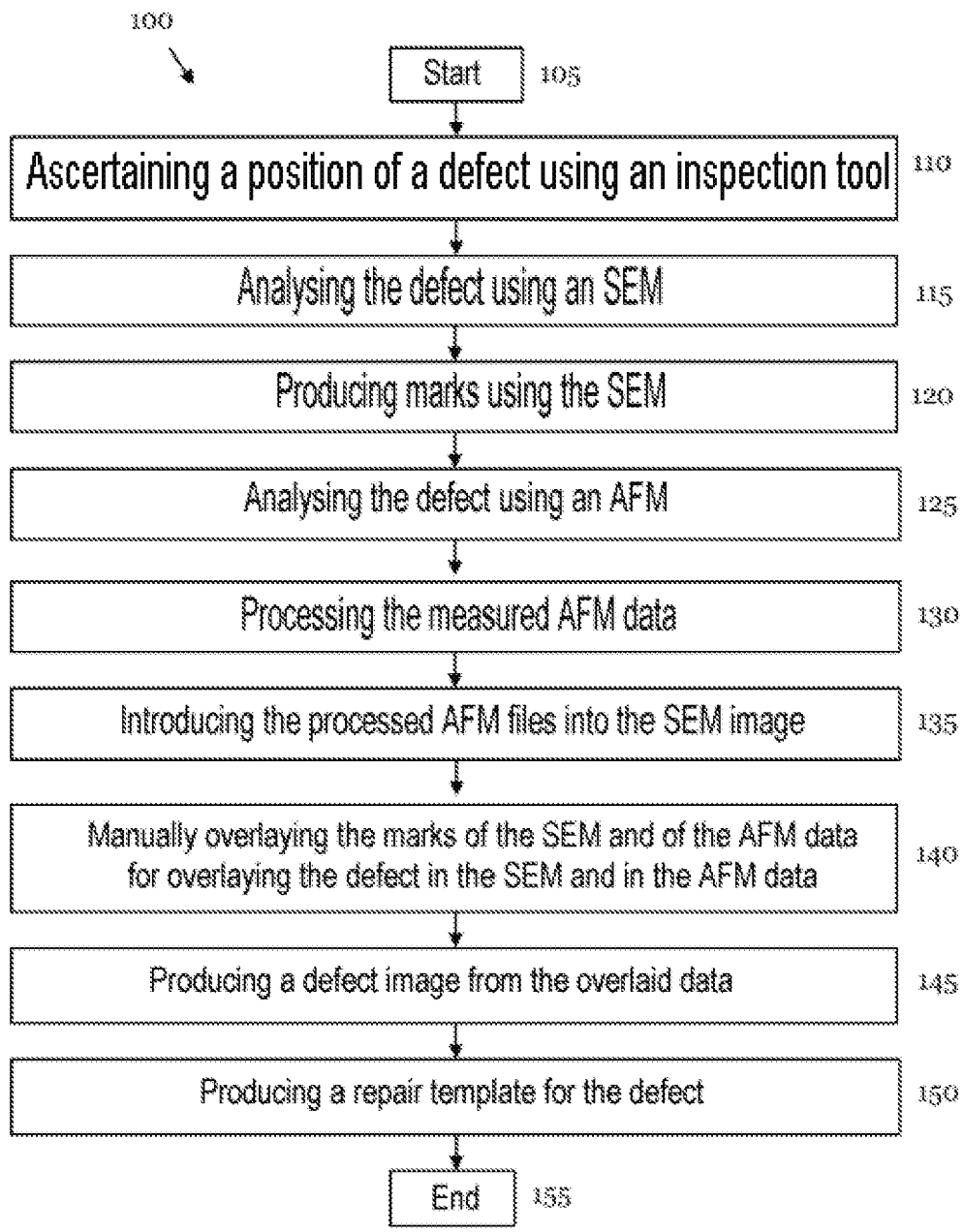
FIG. 1 represents a flowchart for producing a repair template according to the prior art for a defect.

The flowchart 100 in FIG. 1 elucidates the current state for ascertaining a repair template of a defect, which was analyzed with the aid of an atomic force microscope (AFM) as an example of a scanning probe microscope and a scanning electron beam apparatus (SEM; scanning electron microscope) as an example of a scanning particle beam microscope. The AFM and the SEM are integrated in a single apparatus. In the example described in FIG. 1, the defect is visible in the image of an SEM.

The method starts at step 105. The position of a defect of a sample is ascertained at step 110 with the aid of an inspection tool, for example a laser system or an AIMS™ (Aerial Image Measurement System). The defect is scanned with the aid of an electron beam of the SEM at step 115. Thereupon, the SEM produces one or more marks on the sample surface at step 120. This is a complicated process since, in addition to the electron beam of the SEM, at least one deposition gas must be provided in the vicinity of the defect so as to be able to deposit material for a mark. Alternatively, an etching gas may be provided in order to etch one or more marks into the sample by way of an electron-beam-induced etching process.

Below, the expression "sample" is used as an overarching term which, inter alia, comprises photolithographic masks and wafers.

The defect is scanned with the aid of an AFM at step 125. The defect on the sample is found with the aid of the previously produced marks. Subsequently, the data obtained by the scans of the AFM are processed at step 130. At step 135, the processed AFM data are introduced into the image produced by the electron beam of the SEM by scanning the sample in the region of the defect. In the next step 140, the marks in the processed AFM data are overlaid on the marks of the SEM image within the scope of a manual process. Thereupon, an image of the defect is produced at step 145 from the overlaid data of the SEM image and the processed AFM data. At step 150, a repair template for the defect is produced on the basis of the defect image and the method then ends at step 155.

Should the defect be a defect which cannot be made visible, or only be made visible with difficulty, by an SEM, steps 115 and 135 are dispensed with in the diagram 100. Moreover, step 140 of the flowchart is modified. At step 140, the marks of the SEM data and of the AFM data are overlaid, without the defect being visible in the image of the SEM. These modifications are not shown in FIG. 1. A phase defect is an example of a defect which cannot be, or cannot be reliably, detected by an SEM.

Exemplary embodiments of a device which facilitate an improvement of the described process are discussed below. Finally, an embodiment of an improved method for determining a repair template for a defect of a sample is then explained.

Figure 2:
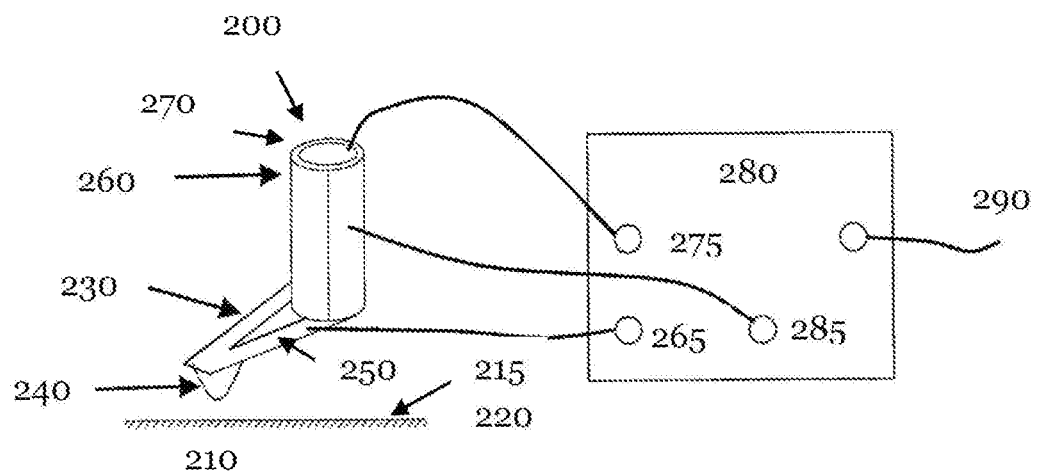
FIG. 2 shows a schematic illustration of some important components of a scanning probe microscope.

FIG. 2 schematically shows some components of a scanning probe microscope 200. The scanning probe microscope 200, just like one of the probe arrangements described below, may be operated under ambient conditions or in a vacuum chamber (not depicted in FIG. 2). The sample 220 is arranged on a sample stage 210. The sample stage 210 may be displaceable in one direction (e.g. in the z-direction), in two directions (e.g. in the x-direction and y-direction) or in three directions, for example by one or more micro-displacement elements or micro-manipulators (not shown in FIG. 2).

The probe 230 comprises a measuring tip 240 and a bar which is referred to as a cantilever 250 below, as is conventional in the art. The cantilever 250 of the probe 230 is attached to the piezo-actuator 260. The free end 270 of the piezo-actuator 260 is fastened to a holding device (not specified in FIG. 2). The holding device comprises displacement elements which bring the probe 230 to the region of the sample 220 to be examined. Alternatively, or additionally, the sample stage 210 may comprise displacement elements for this object (not shown in FIG. 2).

The probe 230 further comprises a sensor element (not depicted in FIG. 2) which measures the deflection of the cantilever 250 of the probe 230. The signal of the sensor element is applied to the input 265 of the control unit 280 of the SPM 200. By way of the output 275 of the control unit 280, the control unit 280 is able to output a corresponding actuating signal to the piezo-actuator 260. The piezo-actuator 260 may thus be operated in a closed loop. Further, the control unit 280 is able to output a signal to the piezo-actuator 260 by way of the output 285 such that the measuring tip 240 of the probe 230 scans over the sample 220. As a result, the probe 230 may scan over part of the sample 220 in a two-dimensional (2D) scan in order to determine a 2D contour of the sample surface 215 in the region of a defect.

Further, the control unit 280 may control the piezo-actuator 260 in such a way that the measuring tip 240 of the probe 230 produces one or more depressions in the sample surface 215 at a defined distance from the scanned defect. Hence, the scanning probe microscope 200 constitutes a simple exemplary embodiment of a device according to the invention.

In the design elucidated in FIG. 2, the piezo-actuator 260 has a tubular form and comprises four external electrodes and one internal electrode. There are various embodiments of piezo-actuators 260. In order to move a probe arrangement comprising a plurality of probes, all designs which are able to carry out the necessary movements of the measuring tip 240 of the probe 230 may be used in addition to the tubular form. In particular, the piezo-actuator 260 may comprise various segments such that the movements in the xy-plane and perpendicular thereto may be controlled by use of separate electrical connectors (not depicted in FIG. 2). The connector 290 may connect the control unit 280 to a computer system (not shown in FIG. 2).

Figure 3:
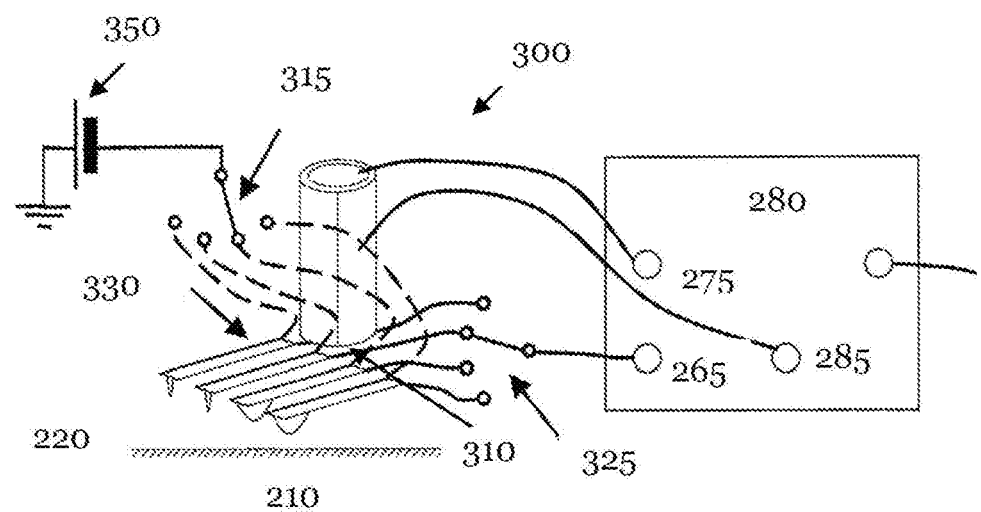
FIG. 3 depicts a schematic illustration of a scanning probe microscope of FIG. 2, comprising a probe arrangement.

The scanning probe microscope 300 in FIG. 3 comprises a probe arrangement 310 with four probes 330, with each of the probes 330, similar to in FIG. 2, comprising a sensor element. The voltage supply 350 is applied to one of the sensor elements of the probes 330 by use of the switch 315. The signal from the sensor element is applied to the input 265 of the control unit 280 of the SPM 300 with the aid of the switch 325. The position of the switch 325 allows selection of that probe 330 from all probes 330 of the probe arrangement 310 whose sensor element is connected to the voltage supply 350 and to the input 265 of the control unit 280. Using this, it is possible to construct a closed feedback or control loop for each of the probes 330, as described in FIG. 2 using the example of a single probe 230.

Figure 4:
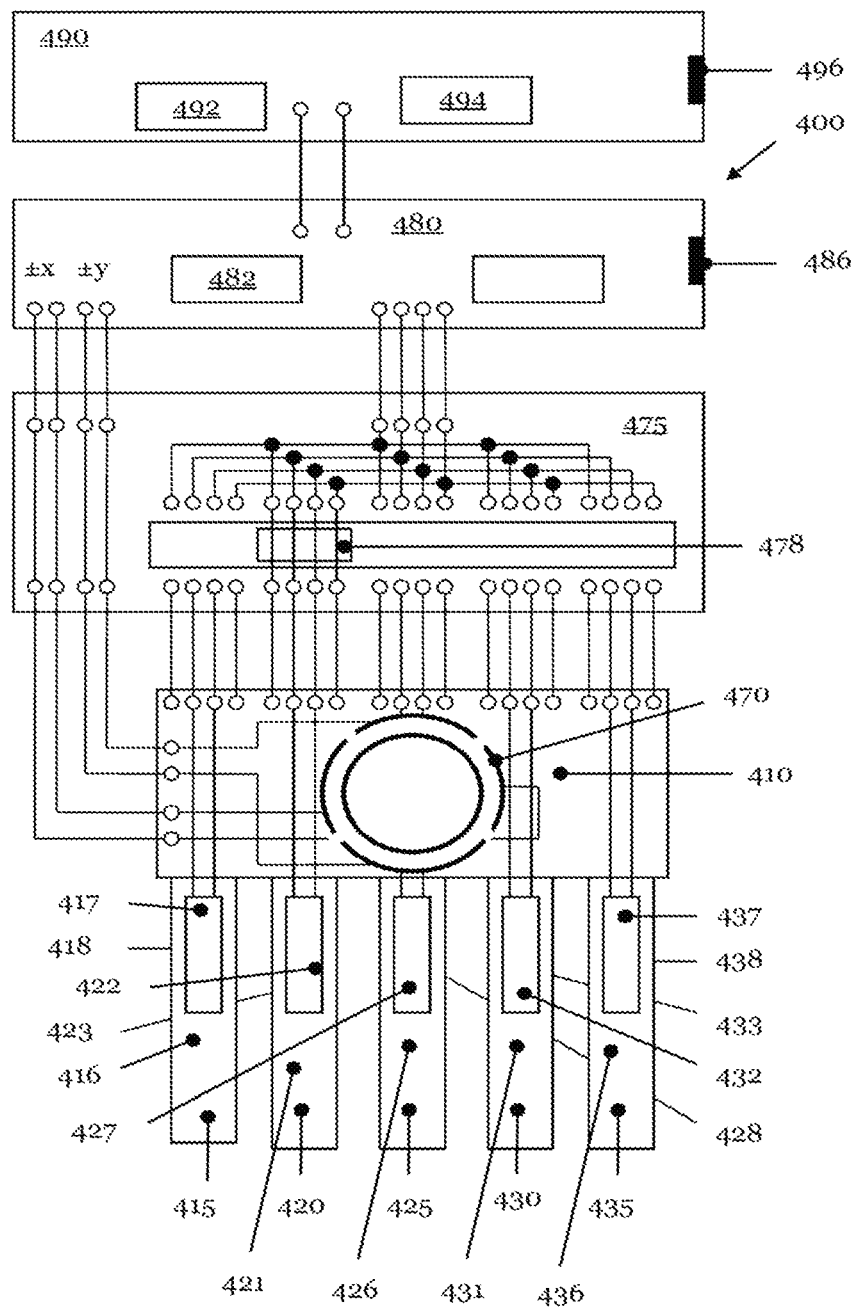
FIG. 4 reproduces a schematic illustration of a probe arrangement in a top view, including a switch-over device and a control unit.

The diagram 400 in FIG. 4 schematically elucidates a top view of a probe arrangement 410 and the electrical connections thereof to the control unit 480 of the scanning probe microscope 300 of FIG. 3. Unlike the example of FIG. 3, the probe arrangement 410 in this example comprises five probes 415, 420, 425, 430 and 435 arranged in parallel. In a manner analogous to FIG. 3, the piezo-actuator 470 is attached to the probe arrangement 410. The opposite or free end of the piezo-actuator 470 is fastened to a holding device of the SPM 300 of FIG. 3 (not depicted in FIG. 4).

The diagram 400 in FIG. 4 schematically illustrates six connectors for the movement of the piezo-actuator 470. Here, the two connectors for the movement in the z-direction, which are connected to the inner metallization of the piezo-actuator 470, are suppressed in FIG. 4 for reasons of clarity. By way of the six connectors, the control unit 480 of the scanning probe microscope 300 is able to control both the movement of the piezo-actuator 470 in the plane of the probe arrangement 410 (xy-plane) and the movement in a direction perpendicular thereto (z-direction). As explained in the discussion relating to FIG. 2, by applying electrical signals to the x- and/or y-connectors of the piezo-actuator 470, the control unit 480 is further able to scan the probes 415, 420, 425, 430 and 435 over the sample 220 parallel to the plane of the probe arrangement 410 and/or additionally move said probes in the z-direction perpendicular thereto.

Moreover, the piezo-actuator 470 facilitates a controlled and reproducible movement of the probe arrangement 410 being carried out relative to the surface of the sample 220 of FIGS. 2 and 3.

The positioning elements or movement elements 417, 422, 427, 432 and 437 are attached to the upper sides of the cantilevers 416, 421, 426, 431, 436 of the probes 415-435. By applying appropriate control signals from the control unit 480, the positioning elements 417, 422, 427, 432 and 437 facilitate bringing the cantilever 416-436 of the corresponding probe 415-435 from the rest position into the working or operational position, and vice versa. By way of example, the positioning elements 417-437 may be embodied as piezo-actuators or as bimetallic elements with resistive heating. The latter bends the cantilever 416-436 of the probe 415-435 in a defined manner in a predetermined direction on account of the electric energy converted into heat. Currently, it is preferred to embody each of the positioning elements 417-437 as a digital element which merely has two defined states, namely a defined rest position and a defined working position, and which is equipped with the function of switching to and fro between the rest position and the working position. However, each of the positioning elements 417-437 may also be configured as an element which has more than two defined states such that they are able to excite the cantilever 416-436 of the corresponding probe 415-435 to vibrate, for example at the resonant frequency thereof.

In an alternative embodiment, use can be made of a laser beam to bring a probe 415-435 from the rest position into the working position (not depicted in FIG. 4). To this end, the cantilever 416-436 of the probe 415-435 is embodied in the form of a bimetallic element. By radiating light onto one of the cantilevers 416-436, the latter bends in the direction of the sample 220 and, as a result, brings the probe 415-435 from the rest position into the working position.

As already touched upon in the discussion relating to FIGS. 2 and 3, sensor elements 418, 423, 428, 433 and 438 are arranged on the cantilevers 416-436 of the probes 415-435 of the probe arrangement 410. In the example of FIG. 4, these are attached to the lower sides of the cantilevers 416-436 of the probes 415-435 and therefore are not visible in the top view of FIG. 4. The position thereof is specified in FIG. 4 by lines without endpoints. Each of the sensor elements 418-438 detects both the bending of the respective cantilever 416-436, and hence the bending of the cantilever 416-436 caused both by the piezo-actuator 470 and by the positioning element 417-437 assigned to the respective cantilever 416-436, and, additionally, the bending of the cantilever 416-436 caused by an action of force between the sample 220 and the probe 415-435, and hence, overall, each of said sensor elements detects the position of the measuring tip attached to the free end. By way of example, the sensor element 418-438 may be embodied as piezo-resistive elements in a Wheatstone bridge circuit.

The arrangement of the positioning element 417-437 and the sensor elements 418-438 on the cantilevers 416-436 of the probes 415-435 may be interchanged in relation to the attachment depicted in FIG. 4. Moreover, both the positioning element 417-437 and the sensor element 418-438 may be attached to one side of the cantilever 416-436 of the probe 415-435.

As already explained in the context of FIGS. 2 and 3, with the aid of the measurement data of the corresponding sensor element 418-438, it is possible to set up a closed loop for the respective probe 415-435 in operation. Using this, the individual probes 415-435 of the probe array 410 may operate in the various modes of operation of the individual probe 230 of FIG. 2.

In order to keep the constructional outlay for installing the probe arrangement 410 into an existing SPM 200 low, a switch-over device 475 is present in the example of FIG. 4 between the probe array 410 and the control unit 480 of the SPM 200 of FIG. 2. Using this, the control unit 480 of the SPM 200 may remain unchanged in relation to the control unit 280 for operating a single probe 230. By displacing the switch 478, the switch-over device 475 connects the operational probe 415-435 of the probe arrangement 410 with the control unit 280 of the SPM 200. In the example shown in FIG. 4, the probe 420 is in the working position while all other probes 415, 425, 430 and 435 are in their rest positions.

Electrical or mechanical switching elements may be used as switch-over device 475. In contrast to the exemplary illustration of FIG. 4, it is not necessary to guide the electrical connectors of the positioning elements 417-437 over the switch-over device 475. Rather, these may be connected directly to the control unit 480. As a result, it is possible to make the switch-over device 475 smaller and the demands on the switch-over device 475, in particular in view of the dielectric strength thereof, are significantly reduced.

The control unit 480 comprises a computing unit 482, which may be embodied in the form of a processor. Further, the control unit 480 contains a non-volatile memory 484, for example in the form of a semiconductor memory. Moreover, the control unit 480 comprises an interface 486 facilitating data interchange for the control unit 480 via a network. The interface 486 may establish a wired and/or a wireless connection to a corresponding network. Alternatively, or additionally, the control unit 480 may communicate with external apparatuses, such as a scanning particle beam microscope, by way of the computer system 490.

In addition to a minor modification of the scanning probe microscope 200, the embodiment of the probe arrangement 410 in FIG. 4 is advantageous in that electric signals are only applied to one probe 415-435 of the probe arrangement 410. Mutual influencing or interference of the signals from probes 415-435 operated in parallel is therefore precluded.

However, the probe arrangement 410 may also be operated without the switch-over device 475 by virtue of the electrical connectors of said probe arrangement being connected directly to a modified control unit of the SPM 300. Using this, two, or all, probes 415-435 may be controlled or operated in parallel by a modified control unit of the SPM 200.

The computer system 490 controls the operation of the probe arrangement 410 via the control unit 480. The computer system 490 comprises a computing unit 492, which may be embodied in the form of one or more processors. Further, the computer system 490 contains a non-volatile memory 484, for example in the form of a hard disk drive and/or a semiconductor memory. Moreover, the computer system 490 comprises an interface 496 to communicate with a distant computer over a network. The interface 496 may establish a wired and/or a wireless connection to one or more networks.

Figure 5:
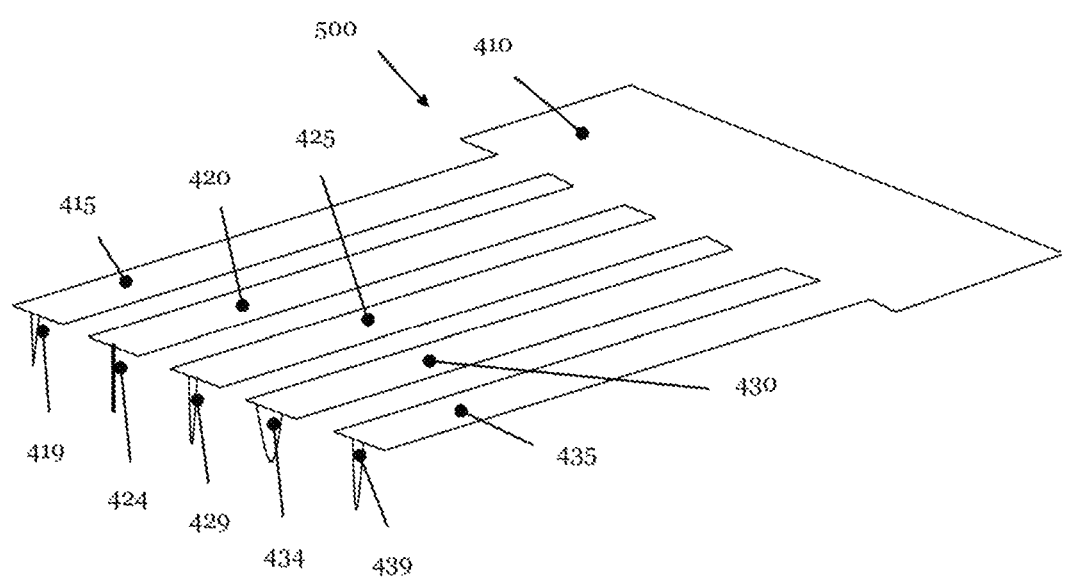
FIG. 5 elucidates a schematically magnified illustration of a probe arrangement with measuring tips optimized for different functions.

FIG. 5 shows the probe arrangement 410 from FIG. 4 from a side, and so the measuring tips 419, 424, 429, 434 and 439 of the probes 415-435 of the probe arrangement 410 are visible. Two tips 419 and 424 of the probes 415 and 420 are designed for analyzing the sample 220. One of these two measuring tips 419 tapers towards the lower end thereof (i.e., it tapers with increasing distance from the cantilever 416) and has a pointed end. This may ensure a high spatial resolution when scanning the sample 220.

The measuring tip 419 comprises the same material as the cantilever 416 of the probe 415. By way of example, silicon or silicon nitride may be used as material. However, the probe array 410 may also be manufactured from any semiconductor material or a combination of semiconductor materials which permits the production of an MEMS (microelectromechanical system). Alternatively, the probe 415 and the measuring tip 419 thereof may also be manufactured from metal, a metal alloy or diamond.

Moreover, the measuring tip 490 may be provided with a coating in order, for example, to make the surface thereof harder and therefore more durable. Moreover, the interaction of the tip 419 with the sample 220 may be adapted by a coating. By way of example, a good conductivity of the measuring tip is important for the embodiment of the SPM 300 in the form of a scanning tunnelling microscope, and so a coating with a high electrical conductivity may be provided in such case. Other modifications of the tip 419, which were developed for individual probes 415-435, may also be applied to the measuring tips 419-439 of the probe arrangement 410.

The second measuring or analysis probe 420 has a long needle-shaped tip 424. By way of example, this needle-shaped measuring tip 424 may comprise a carbon nanotube. The measuring tip 424 may have been attached to the free end of the cantilever 421 of the probe 420 by use of a glue or the measuring tip 424 may have been grown onto the free end of the cantilever 421 by use of vapor deposition. Using this second analysis probe 420, it is possible to scan regions of the surface of the sample 220 which have a very large aspect ratio, i.e. a ratio between depth, or height, of the structure and the smallest lateral extent thereof.

However, the probes for analyzing the sample 220 are not restricted to the measuring tips 419 and 424 of FIG. 5. Rather, the analysis tip(s) may be matched to the respective type of the scanning probe microscope. In addition to the tunnelling current (scanning tunnelling microscope) and the van der Waals forces (scanning force microscope or AFM), many further physical variables are used to examine a sample. Thus, a magnetic force microscope exploits the magnetic interaction between the sample and the probe or the tip thereof. An acoustic scanning microscope uses phonons and an optical near-field scanning microscope uses photons for examining the sample. This list of various SPM types is only exemplary and by no means complete. However, what is common to all of these SPM types is that their analysis probe(s) 415, 420 and their probe(s) which produce the one or more marks are optimized to the respective type of interaction. Moreover, the analysis probe or the analysis probes 415, 420 may be embodied in a manner optimized to each individual one of the aforementioned SPM types.

Moreover, the measuring tip(s) 415, 420 used to analyze the defects of the sample 220 may additionally be adapted to the respective sample or else to specific process parameters. In addition to the already mentioned aspect ratio of the defects, this may, e.g., relate to the required spatial resolution with which the topography of the defects of the sample 220 are intended to be captured. Moreover, the optimization of the measuring tips 419, 424 of the analysis probes(s) 415, 420 may depend on whether the SPM 300 is operated at atmospheric conditions, in a liquid or in vacuo.

The probes 425, 430 and 435 of the probe arrangement 410 are designed for producing marks on, or in, the sample 220.

The probe 425 is designed to deposit molecules onto the sample 220 within the scope of a dip pen nanolithography (DPN) process and thereby produce structures with dimensions in the nanometer range (<100 nm). In this technique, the tip 429 of the probe 425, which is coated by a chemical compound, is used as a dip pen in order to directly write structures as marks onto the sample 220 by scanning the tip 429 over the surface 215 of the sample 220. The chemical compound coating the tip 429 of the probe 425 is referred to—analogously to manual writing—as ink. The distinction is made between molecular inks and liquid inks. Molecular inks contain the molecules to be deposited onto the sample 220 in a solution. By immersing the tip 429 into the ink solution, the tip 429 is coated with ink. The dissolved molecules diffuse onto the sample surface 215 in a water meniscus which forms between the tip 429 and the sample under appropriate humidity conditions on account of capillary condensation.

All materials which are present in liquid form under deposition conditions may be deposited in the form of liquid inks. Liquid inks are written directly onto the sample surface 215 by the tip 429. Here, the deposition conditions are determined by the interaction of the liquid with the tip 429, the interaction of the liquid with the sample surface 215 and the viscosity of the liquid or of the liquid ink. For the purposes of depositing liquid inks, the cantilever 426 of the probe 425 has a supply line for a liquid. The supply line, which is not shown in FIG. 5, ends at the tip 429 of the probe 425 or leads to a hollow tip 429 of the probe 425.

Depending on the selection of the dissolved molecules, the probe 425 is able to produce marks from different materials, such as, e.g., metals, inorganic compounds or organic compounds. Firstly, metals and, secondly, organic compounds are advantageous for producing or writing marks. By way of example, marks which are deposited in the form of metallic nanostructures on a substrate of a transmissive photomask lead to a pronounced material contrast in the image of an electron beam of an SEM. This likewise applies to organic compounds which are deposited on elements of the absorber structure. The elements of the absorber structure of photolithographic masks contain chromium or titanium nitride as main constituents.

The tip 434 of the probe 430 of the probe arrangement 410 is configured to produce marks in the form of metallic nanostructures on the sample 220 by evaporating material in an electric field between the tip 434 and the sample 220. As a result of the small distance between the tip 434 of the probe 430 and the sample surface 215 (a few nanometers or less), an electric voltage between the tip 434 and the surface 215 in the region of a few volts already suffices to produce electric field strengths in the range of $10^8$ V/m to $10^{10}$ V/m. Such extremely high field strengths facilitate producing or writing marks by field emission or electrochemical deposition.

The tip 434 of the probe 430 substantially comprises the material which is intended to be deposited onto the sample 220 as a nanostructured mark. In addition to the voltage for deflecting the probe 430 by way of the voltage source 350 in FIG. 3, a voltage is applied to the tip 434 of the probe 430 to initiate the deposition of the mark(s) by way of field emission. The tip 434 of the probe 430 is slowly dismantled on account of the electrochemical deposition of the mark(s). It is for this reason that, in the exemplary probe arrangement 410, the tip 434 of the probe 430 has a greater radius of curvature than the tip 429 of the probe 425 used to carry out a dip pen process.

In some cases, a worn tip 434 may be substantially restored by virtue of the sample 220 being replaced by a substrate made of the material of the tip 434 and the voltage between the probe 430 and the substrate being reversed. Therefore, the probe 430 may also be used to write a mark into the surface of the sample 220 by local deposition of material from the sample 220. However, the probe 430 is usually replaced in the case of a worn tip 434.

Finally, the probe 435 is optimized for producing marks by producing or writing nanostructures into the surface 215 of the sample 220. Since the processing tip 439 comes into direct contact with the material of the sample 220, the surface of said processing tip should be harder than the surface 215 of the sample 220 in order to ensure an economical service life of the tip 439. This goal may be achieved by the use of hard material, such as, e.g., silicon nitride, and/or a corresponding tempering layer for the processing tip 439. Further, the probe 435 may be optimized for its task by way of a suitable design of the cantilever 436.

By the selection of the radius of curvature of the tip 439 of the probe 435, it is possible to set a compromise between a large spatial resolution (small radius of curvature) on the one hand and a short processing time for producing the mark(s) (large radius of curvature) on the other hand.

Similar to what was discussed in the context of the description of the analysis probes 415 and 420, the probes 425, 430 and 435 for producing marks on the sample 220 are also optimized for the respective function to be carried out.

In the probe arrangement 410 depicted in the diagram 500 in FIG. 5, both the analysis probes 415 and 420 and the probes 425, 430 and 435 for producing marks are designed for a single function. However, a probe arrangement 410 may also comprise probes designed for carrying out a plurality of functions.

Moreover, the probe arrangement 410 in the example of FIGS. 4 and 5 only has five probes by coincidence. As already explained in the discussion of FIG. 2, a scanning probe microscope 200 comprising a single probe 230 is able to examine a defect of a sample 220 or apply one or more marks onto the sample 220. However, the functionality for both functions is restricted. Therefore, a probe arrangement comprising at least two probes is preferred: one probe for analyzing the sample 220 and a further probe for producing at least one mark. An upper limit on the number of probes is set by the number of probes which may be manufactured in a MEMS.

Figure 6:
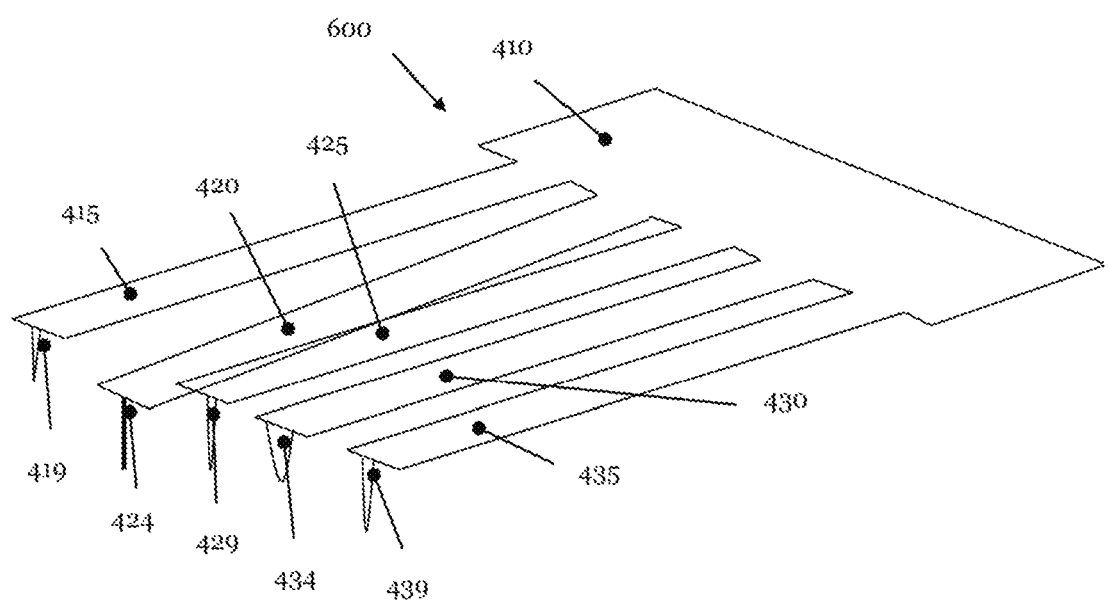
FIG. 6 depicts FIG. 5 with a probe lowered from the rest position into the working position.

FIG. 6 shows the probe arrangement 410 of FIGS. 4 and 5, in which the control unit 480 has moved the probe 420 from the rest position into a working position by applying a control signal to the positioning element 422, and continues to hold said probe in the working position. In the working position, the probe 420 is lowered by 500 nm relative to the rest position. In the working position, the measuring tip 424 of the probe 420 has a distance of 0 nm-50 nm from the sample surface 215. As a result, the tips 419, 429, 434 and 439 of the probes 415, 425, 430 and 435 situated in the rest position have a distance of approximately 500 nm-550 nm from the surface of the sample 220. This ensures that the other tips 419, 429, 434 and 439 do not reach the surface 215 of the sample 220, even in the case of a dynamic mode of operation of the analysis tip 424 by way of the piezo-actuator 470 and cantilevers 416, 426 431, 436 with soft spring constants.

Figure 7:
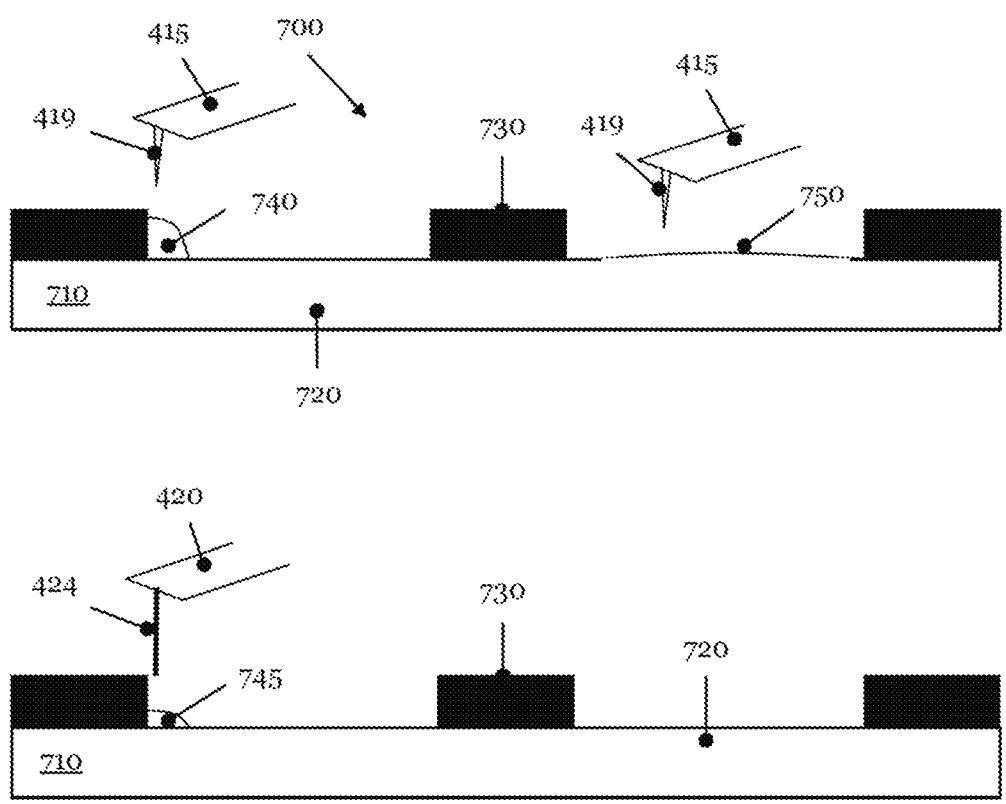
FIG. 7 schematically shows two types of defects on a photomask and of probes of a scanning probe microscope (SPM), which are used for defect analysis.

The diagram 700 in FIG. 7 shows a photolithographic mask 720 comprising a substrate 710 and three elements of an absorber structure 730 as a sample. In the upper partial image, the left-hand element of the absorber structure 730 has a defect 740 of excessive material. The defect 740 may comprise excessive material of the absorber structure or any other material, for example material of the substrate 710 of the photomask 720. The defects 740 may be examined with the probe 415 of the SPM 300, which comprises measuring tip 419. To this end, the measuring tip 419 of the probe 415 is scanned over the defect 740 (not depicted in FIG. 7).

A phase defect 750 of the photomask 720, which manifests itself by a slight upward arching of the substrate 710 over a relatively large substrate region, is depicted between the central element and right-hand element of the absorber structure 730. As already explained above, unevenness in the single digit nanometer range suffices for photomasks for the extreme ultraviolet wavelength range to cause defects in the phase of the radiation reflected by the mask 720. The phase defects 750 may likewise be analyzed by use of the probe 415 of the SPM 300 by virtue of two-dimensional scanning by use of the measuring tip 419.

The lower partial image of the diagram 700 in FIG. 7 represents a second defect 745 of excessive material. Analyzing the defect 745 is made more difficult by the position thereof at an edge of an element of the absorber structure 730. On account of the restricted resolution caused by the radius of curvature of the measuring tip 419, scanning the defect with the probe 415 only supplies a rough image of the surface contour of the defect 745. Therefore, the control unit 480 of the SPM 300 guides the second analysis probe 420, which—as explained above—has a very fine measuring tip 424, over the defects 745 in order to determine the topography of the defects 745 more accurately.

Figure 8:
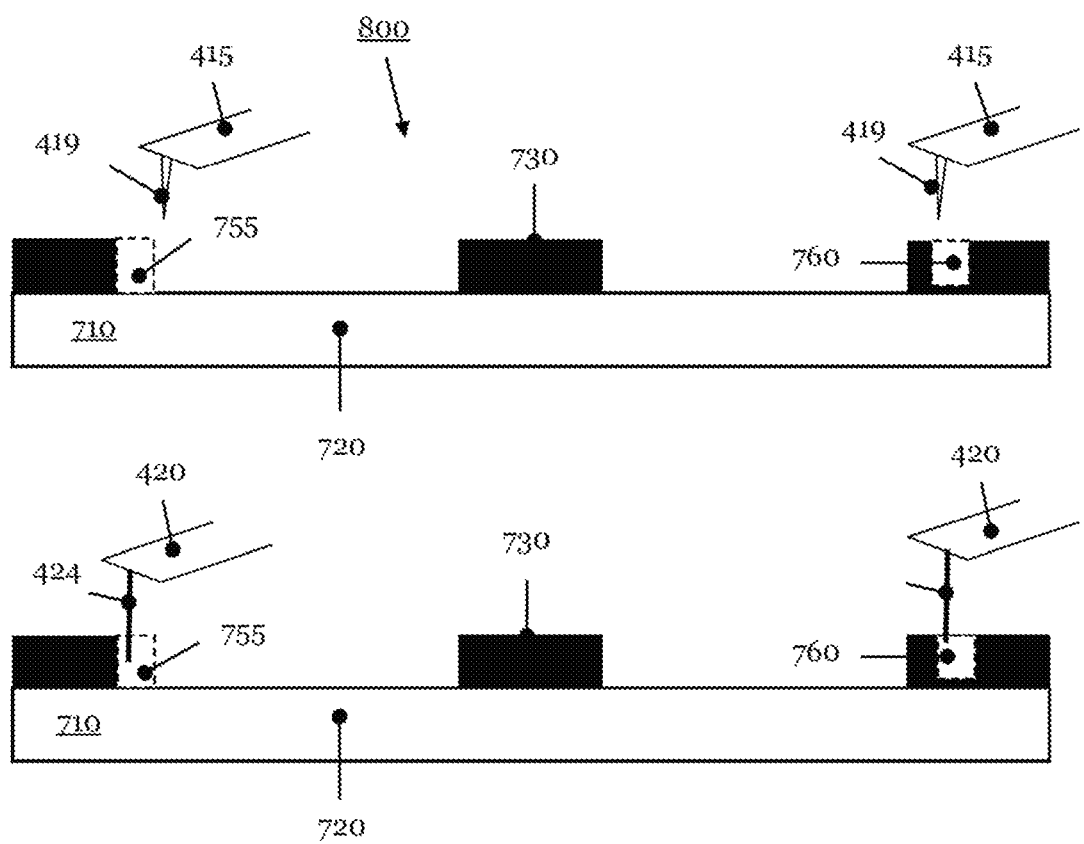
FIG. 8 schematically elucidates two defects of lacking absorber material of a photolithographic mask and specifies probes of an SPM for the analysis thereof.

The diagram 800 in FIG. 8 elucidates a further defect type. The left-hand element of the absorber structure 730 of the photomask 720 is only partly formed. This means that it has a defect of missing absorber material 755. The defect 755 is analyzed using the analysis probe 415 in a first step. On account of the position of the defect 755, the measuring tip 424 of the analysis probe 415 is only able to display the contour of the defect 755 with a restricted resolution. Therefore, the control unit 480 of the SPM 300 scans the probe 420 with the measuring tip 424 over the defect 755 during a second scan in order to ascertain the topography of said defect with the highest possible precision. This is elucidated in the left-hand part of the lower partial image in diagram 800.

In the upper partial image in diagram 800, a further defect of missing absorber material 760 is depicted in the right-hand element of the absorber structure 730. Unlike the defect 755, the absorber material of the photomask 720 is not missing at the edge of an element of the absorber structure but, instead, it is missing within one element. Moreover, a thin layer of absorbing material is present in the region of the defect 760. The problem of determining the precise contour of the defect 760 is further exacerbated compared to the defect 755. After the evaluation of the scan data by the control unit 480 or the computer system 490 has yielded that the defect 760 has steep edges, the defect 760 is once again scanned with the second analysis probe 420, which is designed for the analysis of structures with a high aspect ratio.

From the topography data of the defects 740, 745, 750, 755 and 760, the control unit 480 and/or the computer system 490 of the SPM 300 may in each case determine a repair template for the corresponding defect. The repair template specifies how the defect 740, 745, 750, 755 and 760 should be removed or compensated. The defects 740, 745 of excessive material are preferably removed by an etching process, for example a particle-beam-induced etching process with the aid of an etching gas. For the defects 740, 745, the repair template indicates how long the particle beam acts on each part of the defect 740, 745 and how high the gas flow rate of one or more etching gases is during the repair process.

The defect 755 and 760 are corrected by depositing absorbing material, such as carbon or a carbon compound at the locations of missing absorbing material. The absorbing material is typically deposited at the defective locations with the aid of a particle beam and a deposition gas. The repair templates for the defects 755 and 760 specify how the particle beam and the gas flow rate should be controlled during the correction process.

The phase defect 750 is frequently compensated by a so-called compensational repair. Here, the defect 750 itself is not removed; instead, elements of the absorber structure 720 surrounding the defect 750 are modified in order to mitigate the effects of the phase defect 750 on the image produced by the photomask 720 to the best possible extent. The elements of the absorber structure 730 may be modified by removing parts of the absorber structure 730 or depositing particles of the absorber structure 730. This is typically carried out by a particle-beam-induced etching or deposition process using an etching or deposition gas. The repair templates for the defect 750 describe how the particle beam and the gas flow rate of the etching gas or the deposition gas should be controlled during the compensation process.

Figure 9:
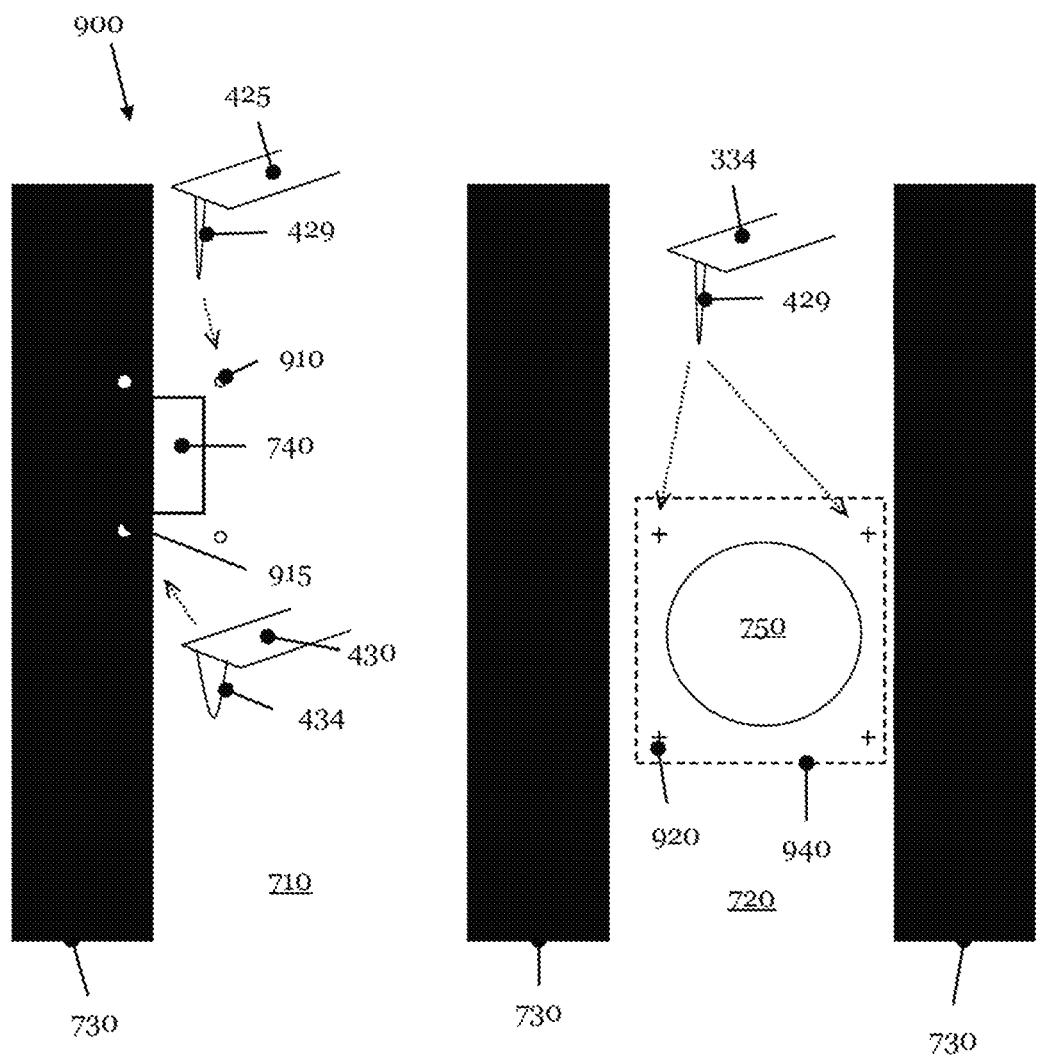
FIG. 9 depicts a top view of the defects from FIG. 7, after the defects were indicated by marks.

The diagram 900 in FIG. 9 shows the defects 740 and 750 in a top view. Further, FIG. 9 depicts marks on the photomask 720 which were applied by probes of the SPM 300. The marks 910 and 915 for the defect 740 have a punctiform embodiment. The two marks 910 applied to the substrate 710 of the photomask 720 may, for example, be carried out by the probe 425 of the SPM 300, which deposits material as a nanostructure on the substrate 710 of the mask 720 in a dip pen process. If the transparent substrate 710 of the mask 720 comprises quartz, it is advantageous to produce the marks 910 as metallic points on the substrate 710. In addition to the topography contrast, metallic marks 910 lead, in particular, to a pronounced material contrast in the image of a scanning particle beam microscope, e.g. a scanning electron microscope (SEM).

The two marks 915 for indicating the defect 740 are produced on an element of the absorber structure 730. The elements of the absorber structure 730 are typically formed from chromium which, on the upper side thereof, comprises a thin oxide layer. The deposition of marks 915 in the form of microstructured metallic points only leads to a small material contrast in an image recorded by a scanning particle beam microscope. Therefore, it is advantageous to use organic materials, such as e.g. carbon or a carbon compound, for deposition of the marks 915 by way of the probe 425 in a dip pen process. The marks 915 on an element of an absorber structure 730 are advantageous in that they—unlike the marks 910—may remain on the element of the absorber structure 730 after completion of the defect correction.

In an alternative embodiment, it is possible to embody the marks 915 in the form of depressions. The depressions of the marks 915 may reach as far as the substrate 710 of the mask 720 and therefore cause a significant material contrast in the image of a particle beam. The tip 439 of the probe 430 of the probe arrangement 410 of the SPM 300 is designed to process the surface of a sample 220 and thus produce depressions in an element of the absorber structure 730 of the photomask 720 (not depicted in FIG. 9).

Moreover, the marks 915 may also be produced by depositing material in a strong electric field between the tip of the probe and the sample surface 215. The cantilever 431 and the tip 434 of the probe 430 are configured to produce a metallic microstructure as a mark 915 on an element of the absorber structure 730 by way of field emission. A metallic mark 915, e.g. made of gold, may moreover result in significant material contrast in the image of a particle beam microscope.

Figure 10:
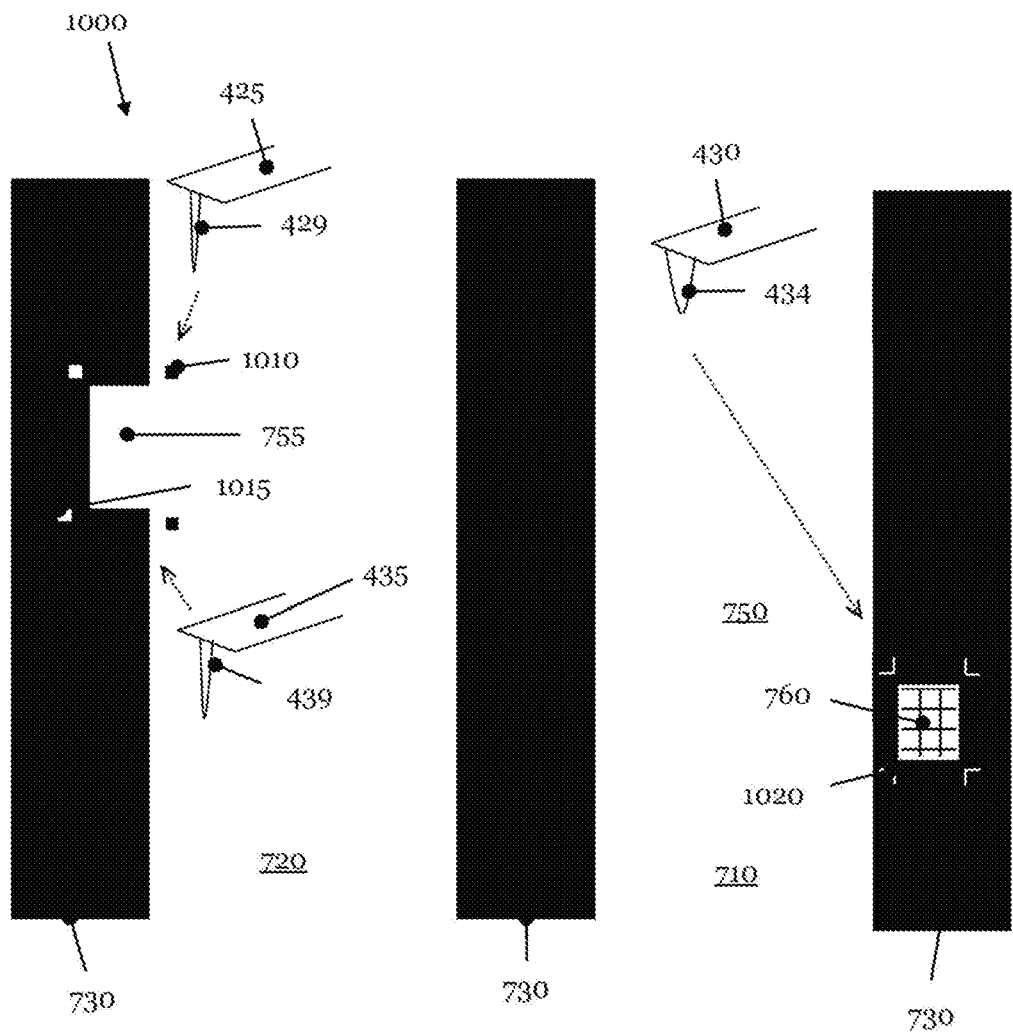
FIG. 10 reproduces a top view of the defects from FIG. 8, after the defects were indicated by marks.

In the example of the diagram 900, as in the subsequent FIG. 10, four marks 910, 915 are produced in each case for one defect 740. However, this is not necessary for indicating a defect. Rather, a single mark 910 or 915 is sufficient to establish a relationship between the coordinates of the defect 740 and the position data of the mark 910 or 915. The coordinates of a defect indicate the region of a mask or a wafer which has a deviation from a corresponding defect-free region of the mask or of the wafer. The position data of a mark indicate a point of the mark, for example the centroid thereof. Alternatively, one corner of a mark may be agreed upon as position data (x/y-value) of the mark. Further, it is possible to agree upon the coordinates of the highest point of the mark being the position data thereof.

The mask 720 may have reference marks in the form of a two-dimensional lattice (not depicted in FIG. 9). By virtue of the SPM 300 determining the position data of the marks 910, 915 relative to the reference marks, the SPM 300 is able to determine the coordinates of the defect 740 in absolute units in relation to the coordinate system of the mask 720. If the mask 720 moreover comprises a fiducial mark as well, the coordinates of the defect or the position data of the mark 910, 915 may be specified in the coordinate system of an SPM 300 and/or in a coordinate system of a repairing device.

On the right-hand side, FIG. 9 shows a defect 750 caused by slight upward arching of the substrate 710 of the photomask 720. Around the defect 750, the probe 425 of the probe arrangement 410 of the SPM 300 is used to apply four cross-shaped marks 920 on the substrate 710. As already explained on the basis of the discussion relating to the marks 910, the marks 920 may be produced by direct writing within the scope of a dip pen process. In addition to producing metallic cross-shaped marks 920, marks 920 made of carbon or carbon-containing compounds may e.g. also be written onto the substrate 710 of the mask 720 with the aid of the tip 429 of the probe 425 by use of a dip pen process.

Producing marks 910, 920 in a DPN process is advantageous in that the marks 910, 920 adhere on the substrate 710 or an element of the absorber structure by adsorption and, as result thereof, may easily be removed after completion of the defect correction.

Around the defect 750, the diagram 900 shows, in the form of a dashed square, the maximum scan region of a probe 415-435 of the probe arrangement 410 of the SPM 300. The marks 920 are arranged within the maximum scan region of a probe 415-435. This obtains the greatest possible accuracy when ascertaining the relationship between the coordinates of the defect 750 and the position data of the marks 920. This is of decisive importance for the phase defect 750 in particular, since—as already explained above—the phase defect 750 does not produce a material contrast and only produces very weak topography contrast, or no topography contrast at all, in the image of a scanning particle beam microscope.

The diagram 1000 in FIG. 10 shows a top view of the defects of missing material 755, 760 of two elements of the absorber structure 730 of the photomask 720 in FIG. 8. On the substrate 710 or an element of the absorber structure 730 of the photomask 720, four marks 1010 and 1015 in the form of small squares were once again applied around the defect 755. Details of applying the marks 1010 and 1015 have already been explained in the context of the discussion relating to FIG. 9. Since the defect 755 is distinguished in the image of the scanning particle beam microscope by way of a topography contrast and a material contrast, it is sufficient to indicate the position of this defect using fewer than four markings.

Four marks 1020 in the form of microstructured angles have likewise been produced around the defect 760 for the purposes of indicating the defect 760 of missing absorber material. By way of example, these may be written by the probe 435 of the probe arrangement 410 using the tip 439 by way of direct writing of depressions into the element of the absorber structure 730. Alternative options for producing the marks have already been discussed within the scope of the discussion relating to FIG. 9.

The defect 760 is delimited by absorber material over the entire circumference thereof. The particle beam of a scanning particle beam microscope is therefore able to precisely image the defect 760. Correcting the defect 760 is also unproblematic. Even a small drift between particle beam and the defect during the repair of the latter would not yet lead to a new defect being caused. Hence, fewer marks 1020 may likewise be produced on the element of the absorber structure for the purposes of indicating the defect 760.

The transition from the analysis mode to the processing or marking mode contains a change from an analysis probe 415 or 420 to one of the probes 425, 430 or 435 for producing a mark 910, 915, 920, 1010, 1015. Such a change is now explained in an exemplary manner on the basis of the transition from the analysis probe 415 to the marking probe 435. The process starts with the switch off of the positioning element 417 of the probe 415. As a result, the probe 415 moves from the working position into the rest position. In the next step, the probe arrangement 410 is withdrawn from the photomask 720 with the aid of the piezo-actuator 470. As a result, the distance between the surface of the photomask 720 and the tips 419, 424, 429, 434 and 439 is increased such that the subsequent displacement of the probe arrangement 410 by the distance between the probes 415 and 435 to be interchanged may be carried out without contact between the tips 419-439 of the probes 415-435 and the photomask 720. In an alternative implementation of the SPM 300, a displacement unit attached to the sample stage 210 carries out this step by moving the sample stage 210. Each of these two steps may be carried out within one second.

Thereupon, the piezo-actuator 470 displaces the probe arrangement 410 by the distance between the analysis probe 415 and the marking probe 435. In an alternative embodiment, displacement elements attached to the sample stage 210 displace the sample stage 210 by the distance between the analysis probes 415 and the marking probe 435. The lateral movement of the sample stage 210 may be carried out by, for example, one or more servo-elements. Further, it is possible to realize a displacement of the probe array 410 and the photomask 720 relative to one another by the distance between the probes 415 and 435 by way of a common movement of the sample stage 210 and the probe arrangement 410. This displacement procedure is complete after a few seconds.

Thereupon, the positioning element 437 of the probe 435 is switched on. This step once again takes less than one second.

An optional part of the entire probe interchange lies in setting or optimizing the control parameters for the probe 435 for producing a mark. This step has to be carried out, inter alia, during the first use of the probe 435 for the photomask 720. Setting the control parameters for the probe 435 is carried out within a few seconds.

After completing the probe interchange process, the piezo-actuator 470 brings the probe arrangement 410 back into the vicinity of the photomask 720 again. In an alternative embodiment, this step may be carried out by a displacement element of the sample stage 210. The duration of this last step once again is a few seconds.

Figure 11:
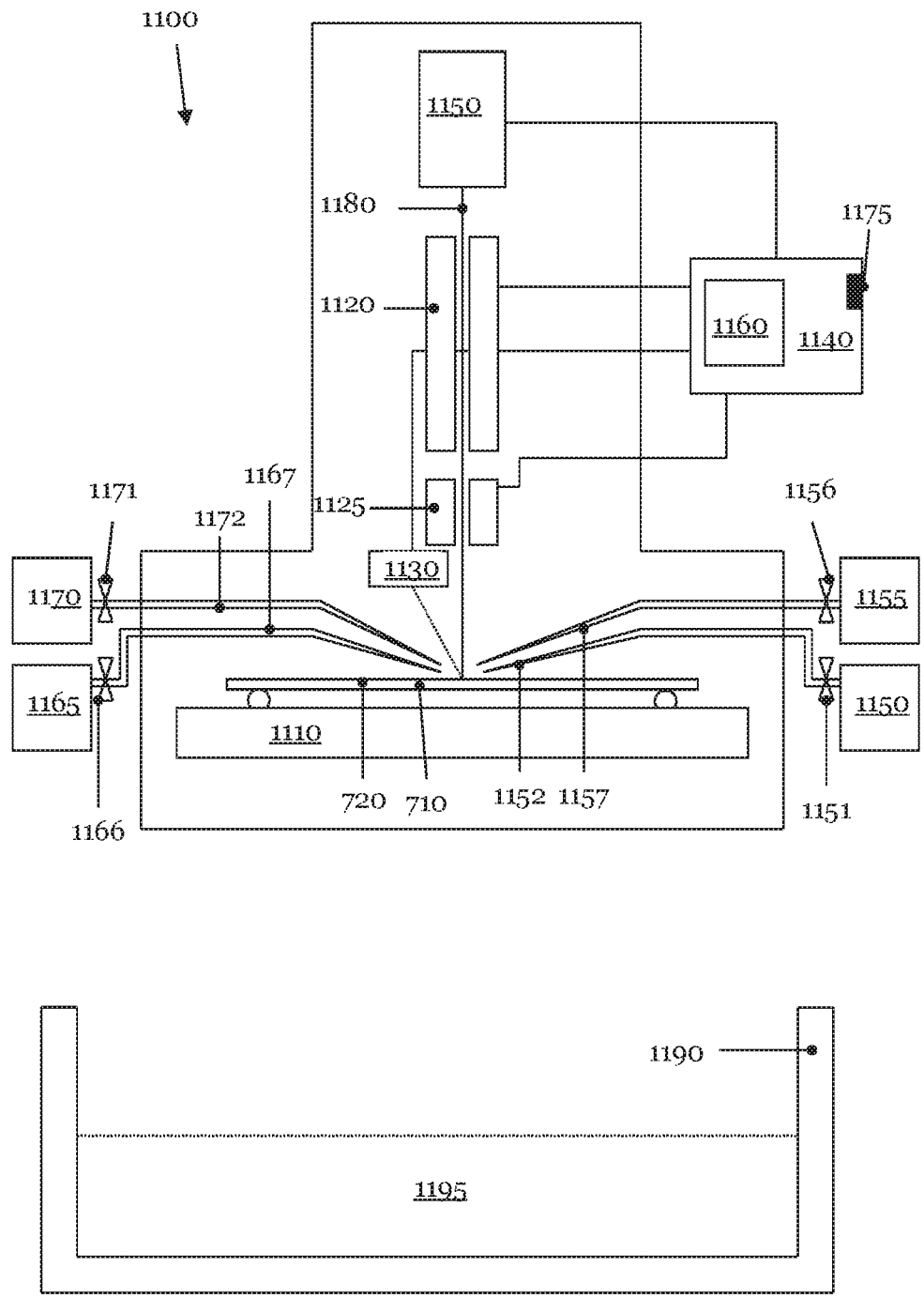
FIG. 11 shows a schematic section through a device, by use of which marks may be read and defects of photolithographic masks or wafers may be corrected.

FIG. 11 shows, in a section, a schematic illustration of preferred components of a device 1100 which may be used to detect the marks 910, 915, 920, 1010, 1015 and 1020 and repair or compensate the defects 740, 745, 750, 755 and 760 of the photomask 720. An exemplary device 1100 in FIG. 11 comprises a modified scanning electron microscope (SEM). An electron gun 1150 produces an electron beam 1180 and the beam-forming and beam-imaging elements 1120 and 1125 direct the focussed electron beam 1180 either onto the substrate 710 of the mask 720 or onto an element of the absorber structure 730 arranged on the substrate 710.

The substrate 710 of the mask 720 is arranged on a sample stage 1110. The sample stage 1110 comprises a displacement unit, not depicted in FIG. 11, with the aid of which the mask 720 may be displaced in a plane perpendicular to the electron beam 1180 such that the defect 740, 745, 755 or 760 of the mask 720 comes to rest under the electron beam 1180. For the purposes of compensating the phase defect 750, the electron beam is directed to the elements of the absorber structure 730 surrounding the defect 750. The sample stage 1110 may further contain one or more elements which may be used to set and control the temperature of the substrate 710 of the mask 720 to a predetermined temperature (not plotted in FIG. 11).

The exemplary device 1100 in FIG. 11 uses an electron beam 1180 as a particle beam. However, this is not mandatory. Rather, use may be made of any particle beam that is able to detect the marks 910, 915, 920, 1010, 1015 and 1020 and induce a local chemical reaction of a precursor gas at the position at which the particle beam is incident on the mask 720 and at which an appropriate gas is provided. Examples of alternative particle beams are: ion beams, atomic beams, molecular beams and/or photon beams.

By scanning over the surface of the mask 720, the electron beam 1180 may be used for recording images of the marks 910, 915, 920, 1010, 1015, 1020 and of the defects 740, 745, 750, 755 and 760 of the mask 720. A detector 1130 for back-scattered and/or secondary electrons, which are produced by the electrons of the incident electron beam 1180, provides a signal which is proportional to the composition of the material of the substrate 710 or to the composition of the material of the elements of the absorber structure 730.

The computer system 1140 may contain algorithms which are realized by hardware and/or software and which facilitate ascertaining an image of the mask 720 from the data signal of the detector 1130. A monitor which is connected to the computer system 1140 may display the calculated image (not shown in FIG. 11). The computer system 1140 may further store the signal data from the detector 1130 and/or the calculated image (likewise not specified in FIG. 11). Moreover, the computer system 1140 may comprise a control unit 1160 which controls or regulates the electron gun 1150 and the beam-shaping and beam-imaging elements 1120 and 1125. Moreover, the control unit 1160 may control the movement of the sample stage 1110 (not elucidated in FIG. 11).

The computer system 1140 comprises an interface 1175, by use of which the computer system 1140 is able to receive position data of the marks 910, 915, 920, 1010, 1015, 1020 and topography data of the defects 740, 745, 750, 755, 760. Further, the computer system 1140 may query repair templates for the defects 740, 745, 750, 755, 760 from the control unit 480 and/or from the computer system 490 of the SPM 300.

The control unit 1160 and/or the computer system 1140 is able to overlay the data from the receiver 1130, which are ascertained with the aid of a scan of the electron beam 1180 over one of the marks 910, 915, 920, 1010, 1015, 1020 and/or one of the defects 740, 745, 750, 755, 760, on the position data of the corresponding marks and the topography data of the corresponding defect. From the combined data, the control unit 1160 and/or the computer system 1140 is able to ascertain a repair template for the defect 740, 745, 750, 755, 760, which may then be used in place of the repair template transmitted by the SPM 300 for the purposes of correcting the corresponding defect.

For the purposes of processing the defect or defects 740, 745, 750, 755, 760, i.e. for the correction or compensation thereof, the exemplary device 1100 in FIG. 11 preferably comprises four different storage containers for different gases or precursor gases. The first storage container 1150 stores a first precursor gas or a deposition gas which is used in conjunction with the electron beam 1180 for deposition of absorbent material at the position of the defects 755, 760. The second storage container 1155 contains a first etching gas, such as e.g. xenon difluoride ($XeF_2$), with the aid of which the defects 740, 745 may be removed from the substrate 710 of the mask 720.

The third storage container 1165 stores a second etching gas, for example a chlorine-containing precursor gas which is used in parallel with, or optionally in place of, the first etching gas for local removal of excessive material from the substrate 710 of the photomask 720. The fourth storage container 1170 houses a second precursor gas, likewise for local deposition of missing absorber material onto the surface of the substrate 710 of the photomask 720.

Each storage tank is equipped with a dedicated valve 1151, 1156, 1166, 1171 to control the amount of gas particles provided per unit of time or the gas flow rate at the location of incidence of the electron beam 1180 on the mask 720. Moreover, each storage container 1150, 1155, 1165, 1170 has a dedicated gas supply 1152, 1157, 1167, 1172, which ends at a nozzle near the point where the electron beam 1180 is incident on the photomask 720. The distance between the point where the electron beam 1180 is incident on the mask 720 and the nozzles of the gas supplies 1152, 1157, 1167, 1172 lies in the region of several millimeters.

In the example depicted in FIG. 11, the valves 1151, 1156, 1061, 1171 are installed in the vicinity of the storage containers. In an alternative embodiment, all or some of the valves 1151, 1156, 1166, 1171 may be arranged in the vicinity of the corresponding nozzle (not shown in FIG. 11). Moreover, the gases of two or more storage containers may be provided by use of a common gas supply; this is likewise not elucidated in FIG. 11.

Each of the storage containers may have a dedicated element for the individual temperature setting and control. The temperature setting facilitates both cooling and heating for each gas. In addition, each gas supply 1152, 1157, 1167, 1172 may likewise have a dedicated element for setting and monitoring the temperature at which each gas is provided at the reaction location (likewise not shown in FIG. 11).

The device 1100 in FIG. 11 comprises a pump system to produce and maintain the required vacuum. Prior to starting a processing process, the pressure in the vacuum chamber is typically approximately $10^{-5}$ Pa to $2 \cdot 10^{-4}$ Pa. The local pressure at the reaction location may then typically rise up to a region around 10 Pa.

For initializing the etching reaction, preferably a focused electron beam 1180 is exclusively used in the device 1100 that is given by way of example in FIG. 11. The acceleration voltage of the electrons lies in the range of 0.01 keV to 50 keV. The current of the employed electron beam varies in an interval between 1 pA and 1 nA.

The device 1100 in FIG. 11 is further designed to remove the marks 910, 915, 920, 1010, 1015, 1020 from the photomask 720. By way of example, the marks 910, 920, 1010 may be removed by scanning the electron beam 1180 and, at the same time, providing an etching gas from either of the storage containers 1155 and 1165. Naturally, it is also possible to use a combination of two or more etching gases for the purposes of removing the marks 910, 920, 1010. Moreover, it is possible to remove the marks 910, 920, 1010 from the substrate 710 of the mask 720 by providing one or more etching gases, without the presence of the electron beam 1180.

The marks 915, 1015, which were produced by deposition of microstructures on an element of the absorber structure 730, may remain on the absorber structure 730 in the majority of cases. However, if the removal thereof is desired or necessary, these marks may be eliminated from the corresponding elements of the absorber structure 730 in an electron-beam-induced etching process using one or more etching gases.

The mark 1020, which was produced by producing a depression in one element of the absorber structure, may be corrected with the aid of the electron beam 1180 and one or more of the deposition gases stored in the storage containers 1150 and 1170.

The device 1100 moreover comprises a cleaning device 1190. The cleaning device 1195 contains a cleaning liquid 1195 or a gas. In an alternative embodiment, the marks 910, 915, 920, 1010, 1015, 1020 may be removed from the mask within the scope of a cleaning step of the mask 720, which is required for the mask production. A dedicated process step for removing the mask may be dispensed with thereby. By way of example, a cleaning fluid in the mask production may be peroxymonosulfuric acid, used in combination with ultrasound.

Figure 12:
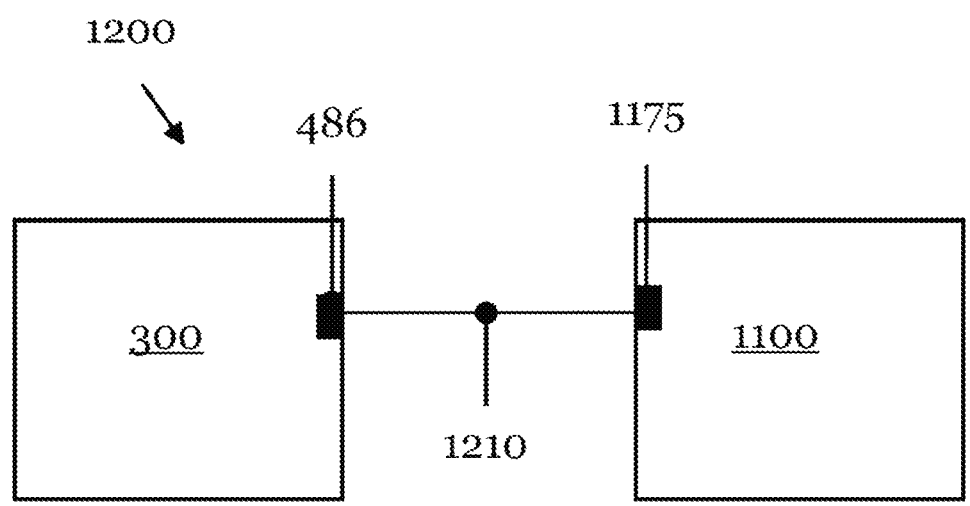
FIG. 12 represents a schematic illustration of a measuring system, which combines the scanning probe microscope of FIG. 3 and the device of FIG. 11.

FIG. 12 shows a measuring system 1200. The measuring system 1200 comprises the above-discussed scanning probe microscope (SPM) 300 and the device 1100 likewise explained above. The SPM 300 comprises the interface 486 and the device 1100 comprises the interface 1175. The two components 300 and 1100 of the measuring system 1200 may communicate with one another by way of the connection 1210. The connection may be an intranet. By way of the connection 1210, the SPM 300 and the device 1100 are able to interchange position data of the marks 910, 915, 920, 1010, 1015, 1020 and topography data of the defects 740, 745, 750, 755, 760 and/or repair templates of the defects.

Figure 13:
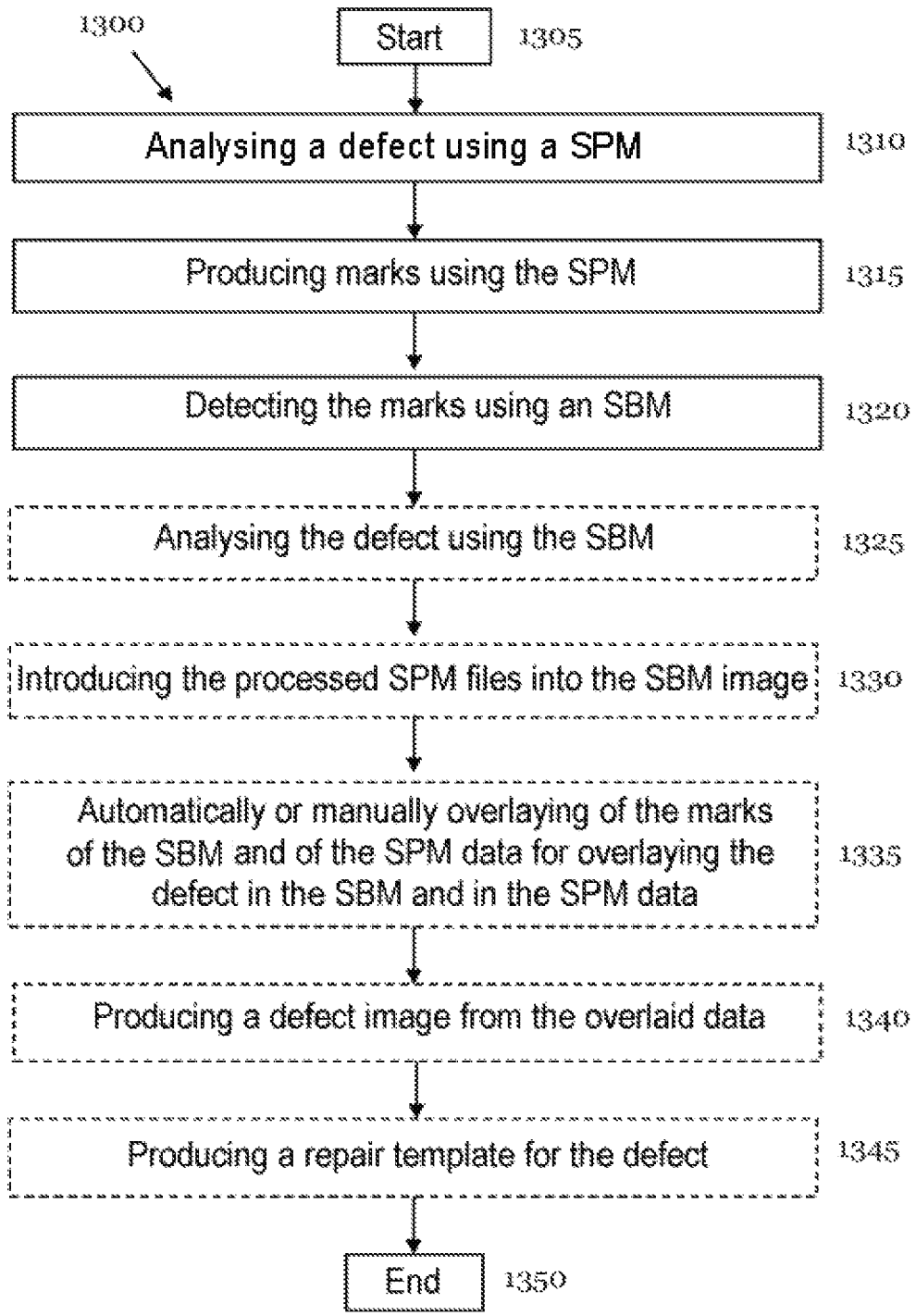
FIG. 13 depicts a flowchart for a method according to the invention.

The flowchart 1300 in FIG. 13 graphically represents the steps of a method according to the invention. In diagram 1300, the abbreviation SBM is used for scanning particle beam microscope.

The method starts at step 1305. At step 1310, a defect 740, 745, 750, 755, 760 of a photomask 720 or of a wafer is analyzed with the aid of a probe 415, 420 of an SPM 300. Preferably, the defect 740, 745, 750, 755, 760 is not examined using an SBM before step 1310. As explained within the scope of the discussion relating to FIG. 1, the SPM 300 typically obtains information about the existence of a defect 740, 745, 750, 755, 760 from examinations using an optical metrology tool, such as e.g. an inspection tool or an AIMS™. Although these tools supply the coordinates of a defect 740, 745, 750, 755, 760, they do not facilitate a defect characterization.

At step 1315, one or more marks 910, 915, 920, 1010, 1015, 1020 are produced on the photomask 720 or the wafer by way of the SPM 300. The SBM is relieved from this task and may, as a result thereof, be increasingly used for other purposes, such as for repairing the defect detected by the SPM 300.

The marks 910, 915, 920, 1010, 1015, 1020 are detected by a scanning particle beam microscope (SBM) at step 1320.

The following steps are optional method steps and are therefore reproduced using dashed lines in the diagram 1300.

At step 1325, the particle beam of the SBM analyzes the defect 740, 745, 750, 755, 760. This is advantageous, in particular, if the defect 740, 745, 755, 760 may be reliably detected by the particle beam of the SBM. By contrast, as already explained above, a scanning particle beam microscope has difficulties to detect a phase defect 750.

Thereupon, the data produced by the SPM 300 are overlaid onto the data recorded by the SBM at step 1330. In the next step 1335, the marks present in the data of the SPM 300 are aligned to the best possible extent with the marks present in the data recorded by the SBM. This may be carried out by manual alignment of the marks. However, an automatic alignment on the basis of an automated identification of markings is preferred.

An image of the defect is produced at step 1340 from the overlaid data of the SPM 300 and of the SBM. Finally, a repair template for the defect is produced at step 1345 from the defect image. The method ends at step 1350.

In an alternative embodiment, a repair template is ascertained directly from the data obtained with the aid of the SPM 300 and made available to the SBM. This procedure is advantageous for phase defects 750 in particular.

A method according to the invention avoids the more complicated process step of producing one or more marks by an SBM. The throughput of the SBM as a repair tool may thereby be increased.

What is claimed is:

1. A scanning probe microscope comprising a probe arrangement for analyzing at least one defect of a photolithographic mask or of a wafer, said scanning probe microscope comprising:
   a. at least one first probe of the probe arrangement of the scanning probe microscope to be scanned across the at least one defect of the photolithographic mask or of the wafer in order to analyze the at least one defect, in which the at least one defect cannot be detected, or cannot be detected reliably, by a scanning particle beam microscope;
   b. means of said scanning probe microscope for producing at least one mark, by means of which the position of the at least one defect on the mask or on the wafer is indicated, in which the at least one defect cannot be detected, or cannot be detected reliably, by the scanning particle beam microscope; and
   c. wherein the mark is embodied in a way that it may be detected by the scanning particle beam microscope.

2. The scanning probe microscope according to claim 1, wherein the means of said scanning probe microscope for producing the at least one mark comprises at least one second probe embodied to produce at least one depression in the photolithographic mask or in the wafer.

3. The scanning probe microscope according to claim 1, wherein the means of said scanning probe microscope for producing the at least one mark comprises at least one second probe embodied to deposit material as at least one mark on the photolithographic mask or on the wafer by applying a voltage to a measuring tip of the at least one second probe.

4. The scanning probe microscope according to claim 1, wherein the means of said scanning probe microscope for producing at least one mark comprises at least one second probe embodied to produce the at least one mark by direct writing in a dip pen nanolithography process.

5. The scanning probe microscope according to claim 1, further comprising a control unit embodied to apply the at least one mark to the photolithographic mask or to the wafer in a way that both the at least one mark and at least part of the at least one defect are arranged in a single scanning region of the scanning probe microscope.

6. The scanning probe microscope according to claim 5, wherein analyzing the at least one defect comprises: determining topography data of the at least one defect and position data of the at least one mark by use of the control unit.

7. The scanning probe microscope according to claim 5, wherein the control unit is further embodied to determine a repair template for correcting the at least one defect from the topography data of the at least one defect.

8. The scanning probe microscope according to claim 5, wherein the control unit is embodied to use design data of the photolithographic mask for determining a position for applying the at least one mark.

9. The scanning probe microscope according to claim 5, further comprising: an interface for transferring the position data of the at least one mark and/or the topography data of the at least one defect and/or the repair template of the at least one defect to the scanning particle beam microscope.

10. A scanning probe microscope comprising a probe arrangement for analyzing at least one defect of a photolithographic mask or of a wafer, said scanning probe microscope comprising:
  at least one first probe of the probe arrangement of the scanning probe microscope to be scanned across the at least one defect of the photolithographic mask or of the wafer in order to analyze the at least one defect;
  means of said scanning probe microscope for producing at least one mark, by means of which the position of the at least one defect on the mask or on the wafer is indicated; and
  a control unit embodied to apply the at least one mark to the photolithographic mask or to the wafer in a way that both the at least one mark and at least part of the at least one defect are arranged in a single scanning region of the scanning probe microscope;
  wherein the mark is embodied in a way that it may be detected by a scanning particle beam microscope.

11. A scanning probe microscope comprising a probe arrangement for analyzing at least one defect of a photolithographic mask or of a wafer, said scanning probe microscope comprising:
  at least one first probe of the probe arrangement of the scanning probe microscope to be scanned across the at least one defect of the photolithographic mask or of the wafer in order to analyze the at least one defect;
  means of said scanning probe microscope for producing at least one mark, by means of which the position of the at least one defect on the mask or on the wafer is indicated;
  wherein the mark is embodied in a way that it may be detected by a scanning particle beam microscope; and
  wherein the means of said scanning probe microscope for producing the at least one mark comprises at least one second probe embodied to deposit material as at least one mark on the photolithographic mask or on the wafer by applying a voltage to a measuring tip of the at least one second probe.

* * * * *